(12) United States Patent
Lyons

(10) Patent No.: US 7,940,374 B2
(45) Date of Patent: May 10, 2011

(54) PARALLEL PROCESS FOCUS COMPENSATION

(75) Inventor: Joseph H. Lyons, Wilton, CT (US)

(73) Assignee: ASML Holding N.V., Veldhoven (NL)

( * ) Notice: Subject to any disclaimer, the term of this patent is extended or adjusted under 35 U.S.C. 154(b) by 359 days.

(21) Appl. No.: 12/164,931

(22) Filed: Jun. 30, 2008

(65) Prior Publication Data

US 2009/0325087 A1    Dec. 31, 2009

(51) Int. Cl.
*G03B 27/52* (2006.01)

(52) U.S. Cl. .......................................... 355/55

(58) Field of Classification Search .................... 355/53, 355/55; 250/548; 356/237.2, 237.4; 430/30
See application file for complete search history.

(56) References Cited

U.S. PATENT DOCUMENTS

| | | | |
|---|---|---|---|
| 6,208,407 B1 * | 3/2001 | Loopstra | 355/53 |
| 6,674,510 B1 * | 1/2004 | Jasper et al. | 355/55 |
| 6,859,260 B2 * | 2/2005 | Nelson et al. | 355/55 |
| 7,239,371 B2 * | 7/2007 | Liegl et al. | 355/55 |

* cited by examiner

*Primary Examiner* — Peter B Kim
*Assistant Examiner* — Chia-how Michael Liu
(74) *Attorney, Agent, or Firm* — Sterne, Kessler, Goldstein & Fox P.L.L.C.

(57) ABSTRACT

Disclosed are systems, methods, and computer program products for parallel process focus compensation. Such methods may include three steps. First, a first sensor senses a top surface of a wafer to provide first-sensor data which defines a first topographic map of the first surface of the wafer. The first sensor may be, for example, an air gauge. Second, a second sensor senses the top surface of the wafer in parallel with the first sensor to provide second-sensor data which defines a second topographic map of the first surface of the wafer. The second sensor may be, for example, an optical sensor or a capacitance sensor. Third, a calibration module calibrates focus-positioning parameters of an exposure system based on the first- and second-sensor data. The calibration module may be embodied in hardware, software, firmware, or a combination thereof.

26 Claims, 22 Drawing Sheets

PARALLEL PROCESS FOCUS COMPENSATION

BACKGROUND

1. Field of the Invention

The present invention generally relates to lithography, and more particularly to systems and methods for focusing a lithographic tool.

2. Background Art

Lithography is widely recognized as a key process in manufacturing integrated circuits (ICs) as well as other devices and/or structures. A lithographic apparatus is a machine, used during lithography, which applies a desired pattern onto a substrate, such as onto a target portion of the substrate. During manufacture of ICs with a lithographic apparatus, a patterning device (which is alternatively referred to as a mask or a reticle) generates a circuit pattern to be formed on an individual layer in an IC. This pattern may be transferred onto the target portion (e.g., comprising part of, one, or several dies) on the substrate (e.g., a silicon wafer). Transfer of the pattern is typically via imaging onto a layer of radiation-sensitive material (e.g., resist) provided on the substrate. In general, a single substrate contains a network of adjacent target portions that are successively patterned. Manufacturing different layers of the IC often requires imaging different patterns on different layers with different reticles. Therefore, reticles must be changed during the lithographic process.

The substrate is imaged using an exposure system. Before the substrate is imaged, however, a focus sensor maps the topography of the top surface of the substrate to determine focus-positioning parameters of the exposure system. Ideally, the focus sensor should sense the top surface of the substrate, and not be affected by underlying layers deposited on the substrate as part of the fabrication process. Additionally, the focus sensor should (i) comply with mechanical packaging constraints, (ii) have a high bandwidth (in order to comply with a desired throughput of the lithographic apparatus), and (iii) have a reasonable working gap (in order to protect the substrate (e.g., silicon wafer)). Commonly used focus sensors include optical and capacitance sensor systems.

Unfortunately, optical and capacitance sensor systems are often affected by the optical and capacitive properties of the underlying layers. For example, light used in an optical sensor system may reflect off an underlying layer and interfere with light reflected off the top surface. Similarly, capacitance sensor systems can be affected, for example, by the permeability and conductivity of the deposited layers, as well as quality and thickness of polish and oxide on the bottom surface of the substrate.

Because optical and capacitance sensor systems may interact with the underlying layers, these types of sensor systems may misread the top surface of the substrate. Errors that are dependent on layers deposited as a result of chip production are called process errors. As a result, data obtained from the optical and capacitance sensor systems will often include these process errors. In fact, the process errors of an optical sensor system can be even larger than the physical thickness of the deposited layers on the substrate. Significant work is then needed to attempt to reduce the process errors, and some focus accuracy may even be lost.

SUMMARY

Given the foregoing, what is needed is systems, methods, and computer program products to compensate for process errors in a lithographic tool. To meet this need, embodiments of the present invention are directed to parallel process focus compensation, and applications thereof.

For example, an embodiment of the present invention provides a method of compensating for process errors in a lithography tool. In this method, a top surface of a wafer is sensed by a first sensor to provide first-sensor data which defines a first topographic map of the top surface of the wafer. This map may be very accurate, but incomplete. The first sensor may be, for example, an air gauge. The top surface of the wafer is also sensed by a second sensor in parallel with the first sensor to provide second-sensor data which defines a second topographic map of the first surface of the wafer. This second map may be complete, but be inaccurate due to process errors. The second sensor may be, for example, an optical sensor or a capacitance sensor. Then, correct focus-positioning parameters of an exposure system are calibrated based on the first- and second-sensor data.

Another embodiment of the present invention provides a system for correcting process errors in a lithography tool. The system includes a first sensor (e.g., an air gauge), a second sensor (e.g., an optical sensor or a capacitance sensor), and a calibration module (e.g., hardware, software, firmware, or a combination thereof). The first sensor is configured to sense a first surface of a wafer to generate a first topographic map of the top surface of the wafer. The second sensor is also configured to sense the top surface of the wafer in parallel with the first sensor to generate a second topographic map of the first surface of the wafer. The second map is used for determining focus-positioning parameters of an exposure system. The calibration module is configured to calibrate the focus-positioning parameters of the exposure system based on the first and second topographic maps.

A further embodiment of the present invention provides a computer-program product that includes a computer-readable storage medium. The computer-readable storage medium has control logic stored therein for causing a computer to compensate for process errors in a lithography tool. The control logic includes first, second, and third computer-readable program code. The first computer-readable program code is configured to cause the computer to receive first-sensor data, wherein the first-sensor data comprises a first-topographic map of a wafer sensed by a first sensor. The second computer-readable program code is configured to cause the computer to receive second-sensor data, wherein the second-sensor data comprises a second-topographic map of the wafer sensed by a second sensor in parallel with the first sensor. The third computer-readable program code is configured to cause the computer to calibrate focus-positioning parameters of an exposure system based on the first- and second-sensor data.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention.

FIGS. 1A and 1B respectively depict reflective and transmissive lithographic apparatuses.

Figure 1A:
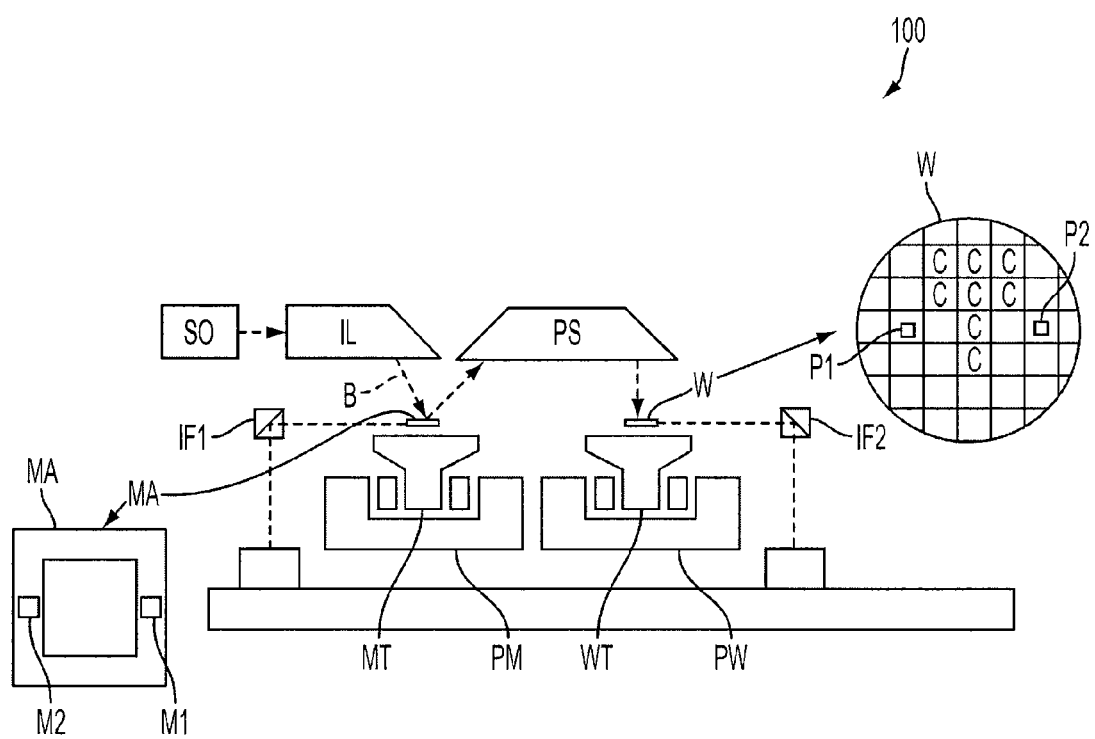

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

I. Introduction

The present invention is directed to parallel process focus compensation, and applications thereof. In the detailed description that follows, references to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

Embodiments of the present invention are directed to compensating for process errors associated with determining focus-positioning parameters of an exposure system. Wafers are divided into fields, where one field is exposed at a time. These process errors can be divided into three categories:

1) Global Process Errors—which can be modeled as constants over an entire wafer;
2) Interfield Process Errors—which are artifacts that are of approximately the same scale as the entire wafer and which are often driven by chemical-mechanical polishing (CMP) and/or resist spin processing; and
3) Intrafield Process Errors—which are a patterned set of errors dictated by position of the measurement with respect to a printed field that is used to expose a wafer.

While the global and interfield process errors can have signatures that vary between individual wafers, the intrafield process errors do not vary much over the fields of a wafer or between wafers in a process. Accordingly, information about the intrafield process errors can be obtained from a first wafer and then applied to other wafers that were processed in a similar manner to the first wafer.

To compensate for intrafield process errors, embodiments of the present invention divide a wafer into fields and obtain an average field for the wafer. The average field is representative of high-frequency features of the wafer. The average field may be obtained either by using a reference sensor (such as, for example, an air gauge) or by using both a reference sensor and a level sensor (such as, for example, an optical sensor or a capacitance sensor). Because the intrafield errors do not vary much over the fields of the wafer or between wafers in a process, in an embodiment the average field is obtained for a single wafer in an off-line phase (e.g., a phase that cannot be performed within a desired throughput of a lithographic tool). The average field is then applied to other wafers in an in-line phase (e.g., a phase that can be performed within the desired throughput of the lithographic tool). In another embodiment, the average field is both obtained and applied in an in-line phase.

In addition to obtaining an average field, the reference sensor maps the wafer to obtain a sparse map of the wafer, and the level sensor maps the wafer to obtain a detailed map of the wafer. The average field is then subtracted from the sparse map (resulting in a field-corrected sparse map) and the detailed map (resulting in a field-corrected detailed map) to compensate for intrafield process errors in both the sparse map and the detailed map.

To compensate for global and interfield process errors, embodiments of the present invention obtain a global fit of a wafer in an in-line phase. The global fit includes global constants and artifacts that are approximately the same scale as the entire wafer. To obtain the global fit, a mathematical fit (such as, for example, a Zernike fit) is applied to the field-corrected sparse map. The global fit is then subtracted from the field-corrected detailed map during an in-line phase to compensate for the global and interfield process errors in the field-corrected detailed map. Because the global fit is obtained and applied to the field-corrected detailed map in an in-line process, embodiments of the present invention compensate for wafer to wafer variations in process dependency (e.g., the global and interfield process errors) without adversely affecting a desired throughput of a lithography tool.

Before describing such embodiments in more detail, however, it is instructive to present an example environment in which embodiments of the present invention may be implemented.

II. An Example Environment for Parallel Process Focus Compensation

As mentioned above, embodiments of the present invention map a wafer using both a reference sensor and a level sensor to compensate for process errors in focus-positioning parameters of an exposure system. Described in more detail below are (A) example lithographic systems in which such reference and lever sensors may be implemented and (B) example reference and level sensors.

A. Example Lithographic Systems

Figure 1B:
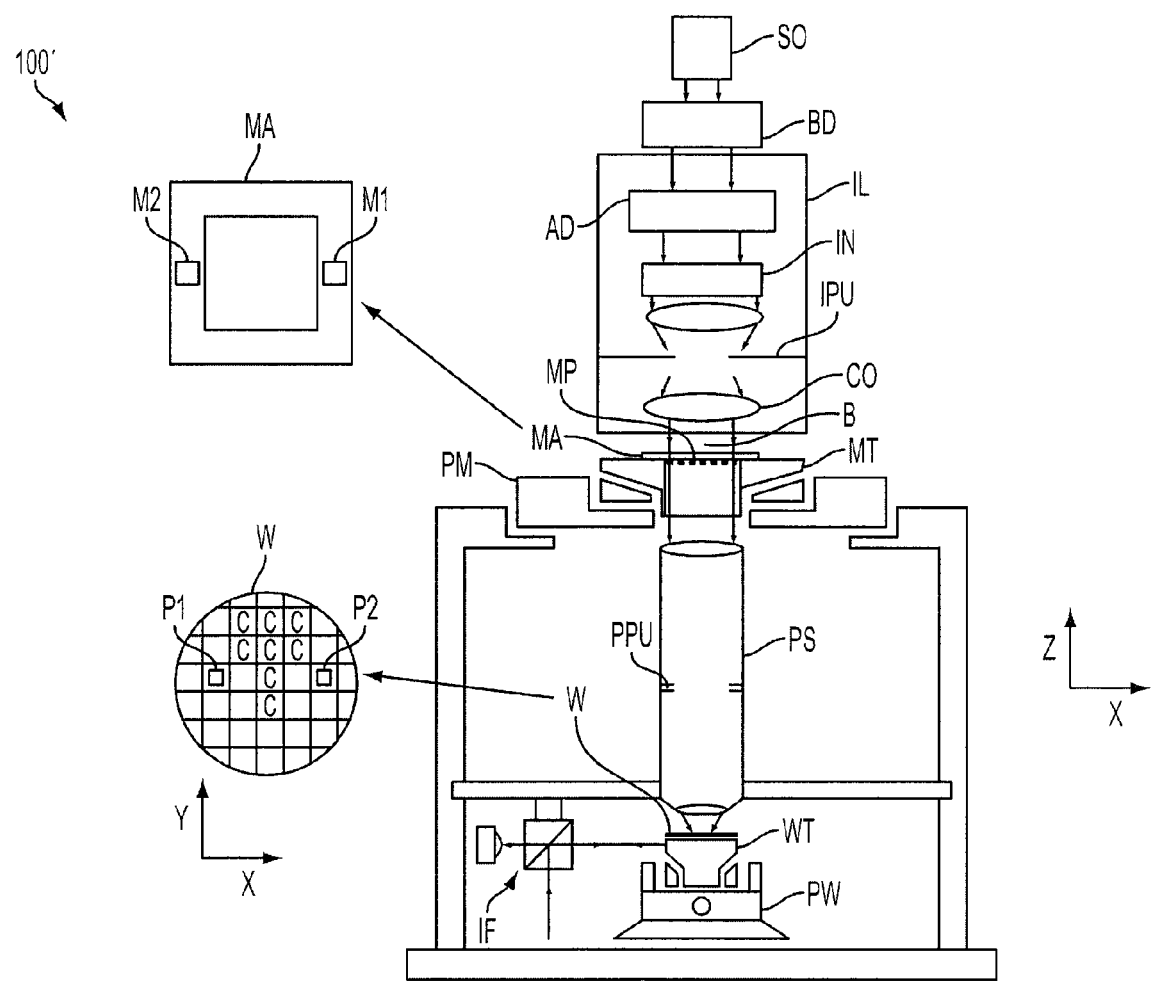

FIGS. 1A and 1B schematically depict lithographic apparatus 100 and lithographic apparatus 100', respectively. Lithographic apparatus 100 and lithographic apparatus 100' each include: an illumination system (illuminator) IL configured to condition a radiation beam B (e.g., DUV or EUV radiation); a support structure (e.g., a mask table) MT configured to support a patterning device (e.g., a mask, a reticle, or a dynamic patterning device) MA and connected to a first positioner PM configured to accurately position the patterning device MA; and a substrate table (e.g., a wafer table) WT configured to hold a substrate (e.g., a resist coated wafer) W and connected to a second positioner PW configured to accurately position the substrate W. Lithographic apparatuses 100 and 100' also have a projection system PS configured to project a pattern imparted to the radiation beam B by patterning device MA onto a target portion (e.g., comprising one or more dies) C of the substrate W. In lithographic apparatus 100 the patterning device MA and the projection system PS is reflective, and in lithographic apparatus 100' the patterning device MA and the projection system PS is transmissive.

The illumination system IL may include various types of optical components, such as refractive, reflective, magnetic, electromagnetic, electrostatic or other types of optical components, or any combination thereof, for directing, shaping, or controlling the radiation B.

The support structure MT holds the patterning device MA in a manner that depends on the orientation of the patterning device MA, the design of the lithographic apparatuses 100 and 100', and other conditions, such as for example whether or not the patterning device MA is held in a vacuum environment. The support structure MT may use mechanical, vacuum, electrostatic or other clamping techniques to hold the patterning device MA. The support structure MT may be a frame or a table, for example, which may be fixed or movable, as required. The support structure MT may ensure that the patterning device is at a desired position, for example with respect to the projection system PS.

The term "patterning device" MA should be broadly interpreted as referring to any device that may be used to impart a radiation beam B with a pattern in its cross-section, such as to create a pattern in the target portion C of the substrate W. The pattern imparted to the radiation beam B may correspond to a particular functional layer in a device being created in the target portion C, such as an integrated circuit.

The patterning device MA may be transmissive (as in lithographic apparatus 100' of FIG. 1B) or reflective (as in lithographic apparatus 100 of FIG. 1A). Examples of patterning devices MA include reticles, masks, programmable mirror arrays, and programmable LCD panels. Masks are well known in lithography, and include mask types such as binary, alternating phase shift, and attenuated phase shift, as well as various hybrid mask types. An example of a programmable mirror array employs a matrix arrangement of small mirrors, each of which may be individually tilted so as to reflect an incoming radiation beam in different directions. The tilted mirrors impart a pattern in the radiation beam B which is reflected by the mirror matrix.

The term "projection system" PS may encompass any type of projection system, including refractive, reflective, catadioptric, magnetic, electromagnetic and electrostatic optical systems, or any combination thereof, as appropriate for the exposure radiation being used, or for other factors, such as the use of an immersion liquid or the use of a vacuum. A vacuum environment may be used for EUV or electron beam radiation since other gases may absorb too much radiation or electrons. A vacuum environment may therefore be provided to the whole beam path with the aid of a vacuum wall and vacuum pumps.

Lithographic apparatus 100 and/or lithographic apparatus 100' may be of a type having two (dual stage) or more substrate tables (and/or two or more mask tables) WT. In such "multiple stage" machines the additional substrate tables WT may be used in parallel, or preparatory steps may be carried out on one or more tables while one or more other substrate tables WT are being used for exposure. When the preparatory steps can be performed while one or more other substrate tables WT are being used for exposure, the preparatory steps are said to occur during an "in-line phase" because the preparatory steps are performed within the desired throughput of the lithographic apparatus 100 and/or lithographic apparatus 100'. In contrast, when the preparatory steps cannot be performed while one or more other substrate tables WT are being used for exposure, the preparatory steps are said to occur during an "off-line phase" because the preparatory steps cannot be performed within a desired throughput of lithographic apparatus 100 and/or lithographic apparatus 100'. As described in more detail herein, focus-positioning parameters of an exposure system (such as, for example projection system PS of lithographic apparatuses 100, 100') may be determined in an off-line phase, an in-line phase, or a combination thereof.

Referring to FIGS. 1A and 1B, the illuminator IL receives a radiation beam from a radiation source SO. The source SO and the lithographic apparatuses 100, 100' may be separate entities, for example when the source SO is an excimer laser. In such cases, the source SO is not considered to form part of the lithographic apparatuses 100 or 100', and the radiation beam B passes from the source SO to the illuminator IL with the aid of a beam delivery system BD (FIG. 1B) comprising, for example, suitable directing mirrors and/or a beam expander. In other cases, the source SO may be an integral part of the lithographic apparatuses 100, 100'—for example when the source SO is a mercury lamp. The source SO and the illuminator IL, together with the beam delivery system BD, if required, may be referred to as a radiation system.

The illuminator IL may comprise an adjuster AD (FIG. 1B) for adjusting the angular intensity distribution of the radiation beam. Generally, at least the outer and/or inner radial extent (commonly referred to as σ-outer and σ-inner, respectively) of the intensity distribution in a pupil plane of the illuminator may be adjusted. In addition, the illuminator IL may comprise various other components (FIG. 1B), such as an integrator IN and a condenser CO. The illuminator IL may be used to condition the radiation beam B, to have a desired uniformity and intensity distribution in its cross section.

Referring to FIG. 1A, the radiation beam B is incident on the patterning device (e.g., mask) MA, which is held on the support structure (e.g., mask table) MT, and is patterned by the patterning device MA. In lithographic apparatus 100, the radiation beam B is reflected from the patterning device (e.g., mask) MA. After being reflected from the patterning device (e.g., mask) MA, the radiation beam B passes through the projection system PS, which focuses the radiation beam B onto a target portion C of the substrate W. With the aid of the second positioner PW and position sensor IF2 (e.g., an interferometric device, linear encoder or capacitive sensor), the substrate table WT may be moved accurately, e.g. so as to position different target portions C in the path of the radiation beam B. Similarly, the first positioner PM and another position sensor IF1 may be used to accurately position the patterning device (e.g., mask) MA with respect to the path of the radiation beam B. Patterning device (e.g., mask) MA and substrate W may be aligned using mask alignment marks M1, M2 and substrate alignment marks P1, P2.

Referring to FIG. 1B, the radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g., an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1B) can be used to accurately position the mask MA with respect to the path of the radiation beam B, e.g., after mechanical retrieval from a mask library, or during a scan.

In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (known as scribe-lane alignment marks). Similarly, in situations in which more than one die is provided on the mask MA, the mask alignment marks may be located between the dies.

The lithographic apparatuses 100 and 100' may be used in at least one of the following modes:

1. In step mode, the support structure (e.g., mask table) MT and the substrate table WT are kept essentially stationary, while an entire pattern imparted to the radiation beam B is projected onto a target portion C at one time (i.e., a single static exposure). The substrate table WT is then shifted in the X and/or Y direction so that a different target portion C may be exposed.

2. In scan mode, the support structure (e.g., mask table) MT and the substrate table WT are scanned synchronously while a pattern imparted to the radiation beam B is projected onto a target portion C (i.e., a single dynamic exposure). The velocity and direction of the substrate table WT relative to the support structure (e.g., mask table) MT may be determined by the (de-)magnification and image reversal characteristics of the projection system PS.

3. In another mode, the support structure (e.g., mask table) MT is kept substantially stationary holding a programmable patterning device, and the substrate table WT is moved or scanned while a pattern imparted to the radiation beam B is projected onto a target portion C. A pulsed radiation source SO may be employed and the programmable patterning device is updated as required after each movement of the substrate table WT or in between successive radiation pulses during a scan. This mode of operation may be readily applied to maskless lithography that utilizes programmable patterning device, such as a programmable mirror array of a type as referred to herein.

Combinations and/or variations on the described modes of use or entirely different modes of use may also be employed.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion," respectively.

The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g., having a wavelength of or about 365, 248, 193, 157 or 126 nm) or extreme ultraviolet radiation (e.g., having a wavelength of 5 nm or above).

The term "lens," where the context allows, may refer to any one or combination of various types of optical components, including refractive and reflective optical components.

B. Example Reference and Level Sensors

Figure 2:
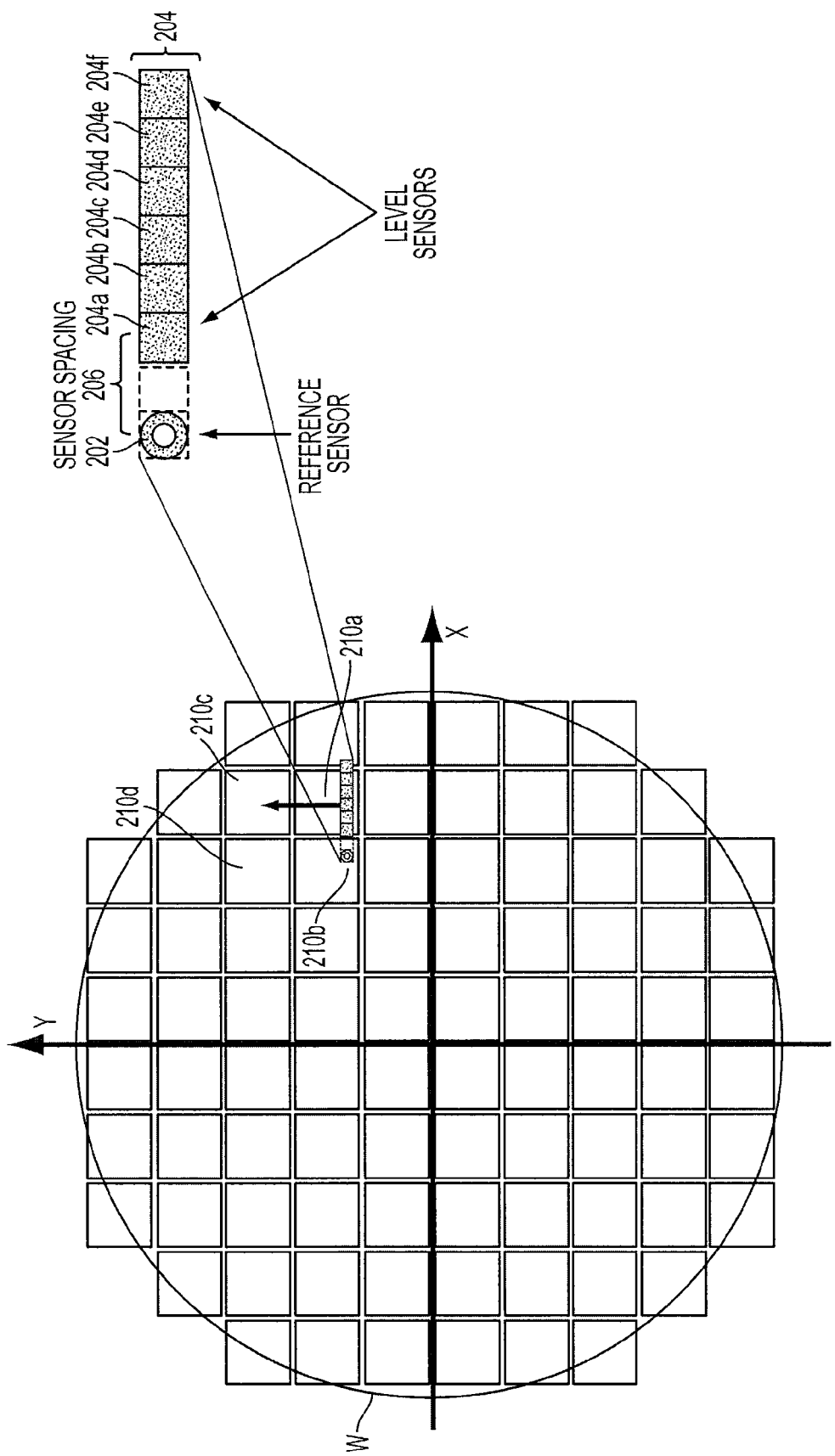
FIG. 2 depicts a plan view of an example reference sensor and level sensor.

FIG. 2 illustrates a plan view of a reference sensor 202 and a level sensor 204 in accordance with embodiments of the present invention. In an embodiment, reference sensor 202 is an air gauge, and level sensor 204 is an optical sensor or a capacitance sensor. But the invention is not limited to these embodiments. Other types of sensors may be used without deviating from the spirit and scope of the present invention, including having multiple sensors for reference 202 in order to increase throughput or coverage.

Referring to FIG. 2, reference sensor 202 is separated from level sensor 204 by a sensor spacing 206. Level sensor 204 includes a plurality of level sensors 204a-f. Reference sensor 202 and level sensor 204 are configured to process fields of wafer W in parallel. For example, as reference sensor 202 processes field 210b of wafer W, level sensor 204 processes field 210a of wafer W. Reference sensor 202 and level sensor 204 are then scanned along a first direction of wafer W (e.g., a Y direction as illustrated in FIG. 2), such that reference sensor 202 will process field 210d and level sensor 204 will process field 210c. By moving reference sensor 202 and level sensor 204 relative to the fields of wafer W along the first direction (e.g., Y direction) and a second direction (e.g., X direction), reference sensor 202 and level sensor 204 each scan wafer W to generate respective maps of wafer W.

Figure 3:
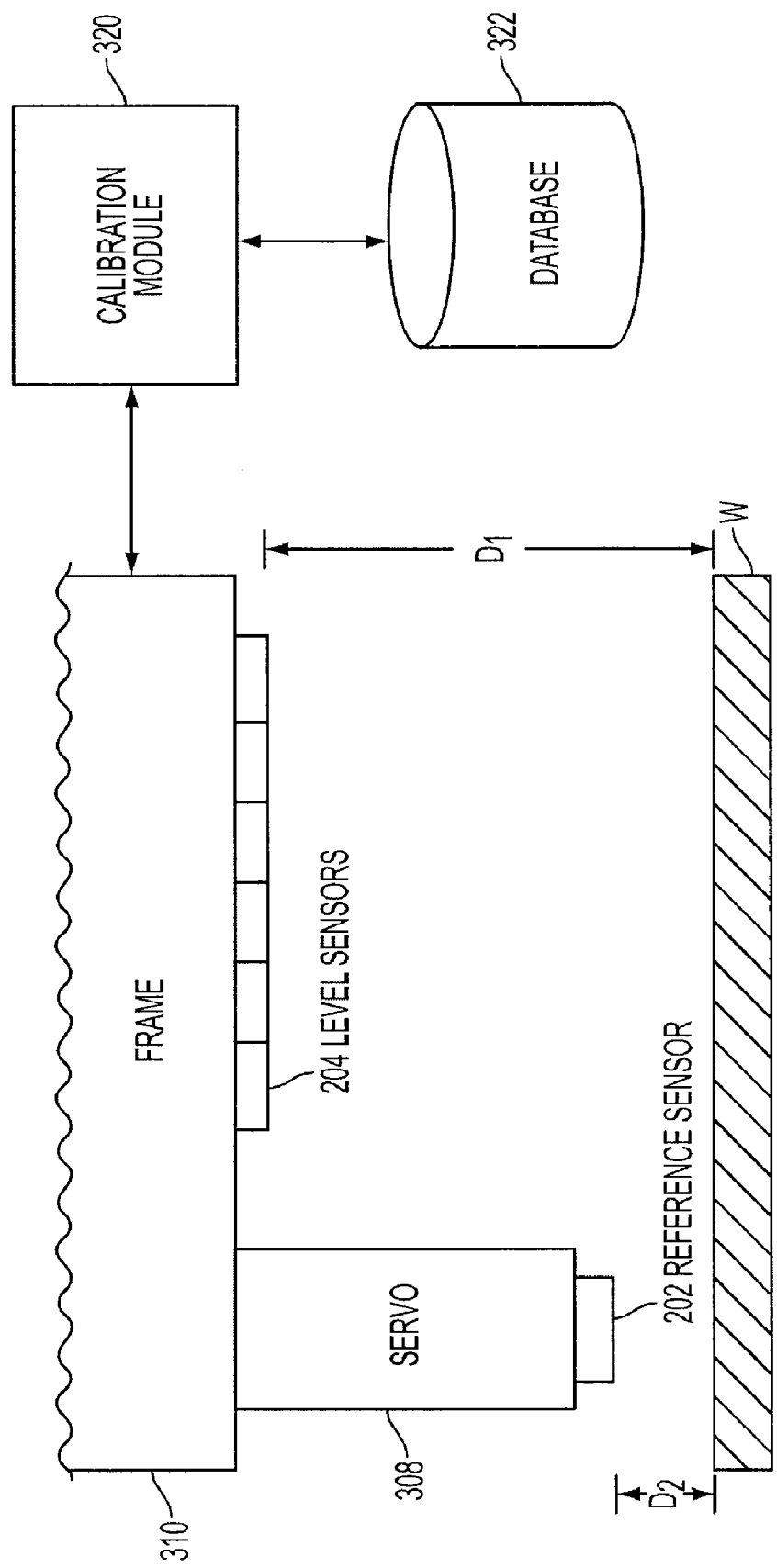
FIG. 3 depicts a side view of an example reference sensor and level sensor.

FIG. 3 illustrates a side view of reference sensor 202 and level sensor 204. As illustrated in FIG. 3, reference sensor 202 and level sensor 204 are suspended with respect to wafer W by a frame 310. In an embodiment, a gap $D_1$ (such as, for example, approximately 3 mm) between level sensor 204 and wafer W is different than a gap $D_2$ (such as, for example, approximately 100 microns) between reference sensor 202 and wafer W. In this embodiment, a servo 308 is coupled between reference sensor 202 and frame 310. Servo 308 may extend and/or retract to achieve a desired gap $D_2$ between reference sensor 202 and wafer W.

Reference sensor 202 and level sensor 204 are coupled to a calibration module 320, which is in turn coupled to a database 322. As explained in more detail below, calibration module 320 is configured to compensate for process errors in focus-positioning parameters based on maps of wafer W obtained by reference sensor 202 and level sensor 204. Calibration module 320 may be implemented in hardware, software, firmware, or a combination thereof. Database 322 is configured to store data collected by reference sensor 202 and level sensor 204. For example, database 322 may store an average field that is determined using data collected by reference sensor 202 and level sensor 204 during an off-line phase. Then during an in-line phase, calibration module 320 may access the stored average field during compensation of the process errors. These and other example methods are described in more detail below.

III. Example Methods for Parallel Process Focus Compensation

Figure 4:
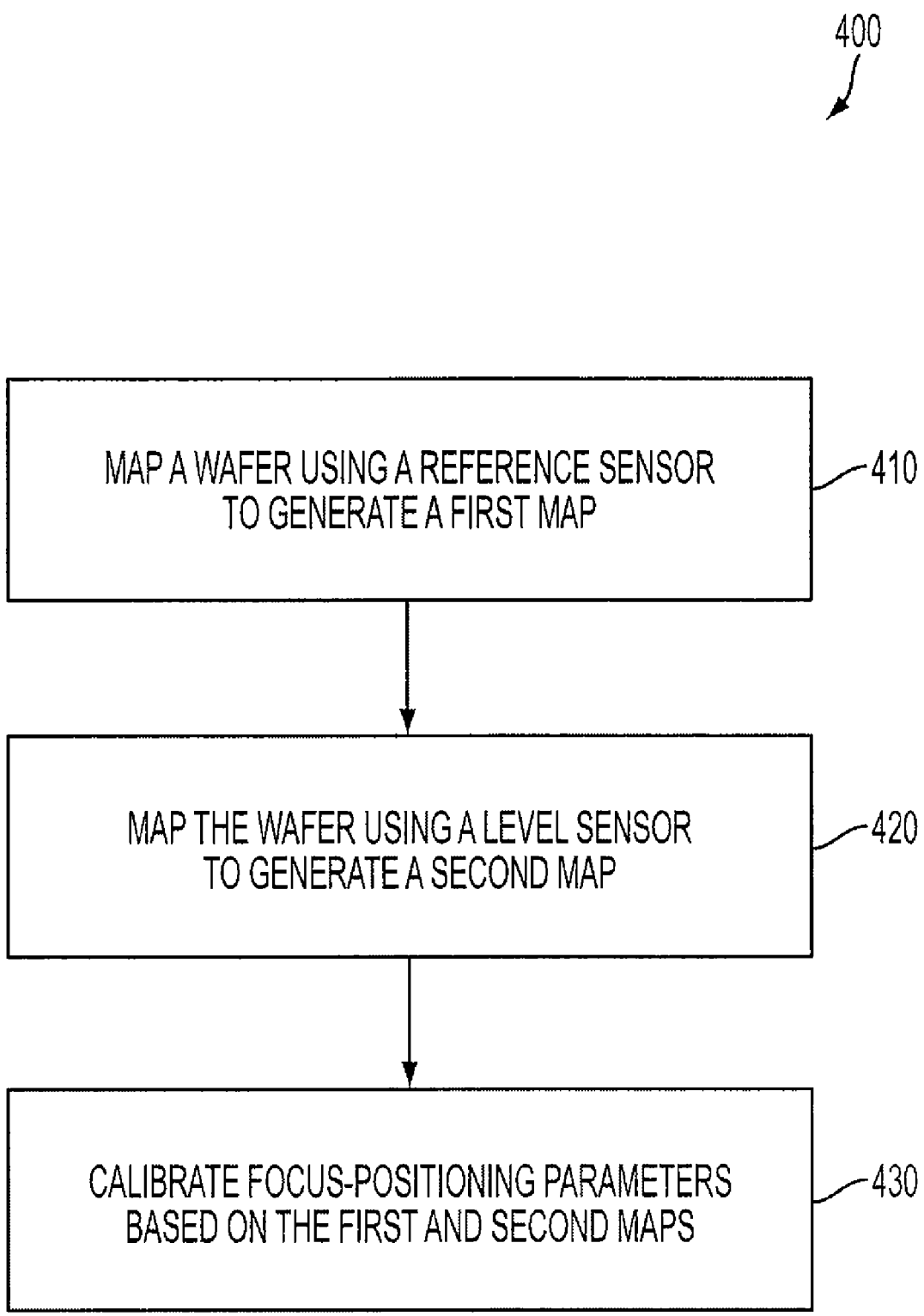
FIG. 4 depicts a flow diagram illustrating an example method for compensating for process errors of a level sensor.

FIG. 4 depicts a flow diagram 400 illustrating an example method of compensating for process errors in a lithography tool in accordance with an embodiment of the present invention.

In a step 410, a reference sensor (such as, for example, reference sensor 202 of FIGS. 2 and 3) maps a wafer to generate a first topographic map of the wafer. In particular, the reference sensor measures one or more features of a first surface of the wafer at a desired mapping speed and a desired accuracy to generate the first topographic map. The one or more features may comprise, for example, a patterned set of errors dictated by position of a measurement with respect to a printed field that is used to expose the wafer.

In a step 420, a level sensor (such as, for example, level sensor 204 of FIGS. 2 and 3) maps the wafer in parallel with the reference sensor to generate a second topographic map of the wafer. The second topographic map is used to determine focus-positioning parameters of an exposure system (such as, for example, projection system PS of lithographic apparatus 100 and/or lithographic apparatus 100').

In a step 430, the one or more features measured by the reference sensor are used to calibrate process errors in the focus-positioning parameters associated with the second sensor. The process errors may be calibrated by a calibration module (such as, for example calibration module 320).

As set forth in more detail below, the example method illustrated in FIG. 4 may be implemented as (A) a two-phase method or (B) a one-phase method.

A. An Example Two-Phase Method

Figure 5:
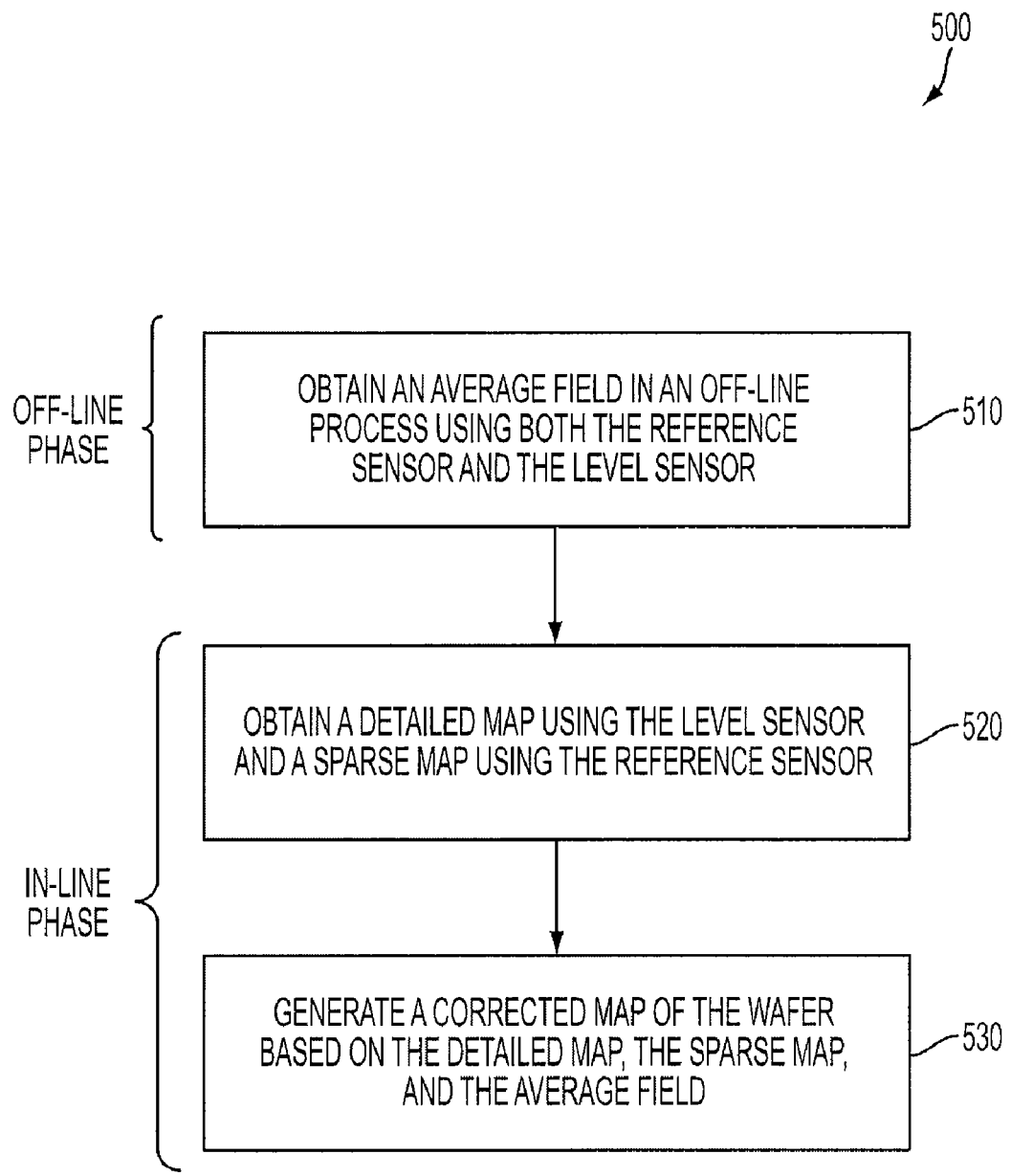
FIG. 5 depicts a flow diagram illustrating an example two-phase method for compensating for process errors of a level sensor.

FIG. 5 depicts a flow diagram 500 illustrating an overview of an example two-phase method to compensate for process errors in a lithography tool. In particular, this example method includes an off-line phase (during which a step 510 occurs) and an in-line phase (during which steps 520 and 530 occur). FIGS. 6-11 illustrate various aspects of the off-line and in-line phases of the method of FIG. 5. The example method of FIG. 5 may be implemented, for example, when the scan speed of a reference sensor is not commensurate with the desired throughput of a lithographic apparatus (e.g. when the scan speed of the reference sensor is too slow). This example method is described in more detail below.

Figure 6:
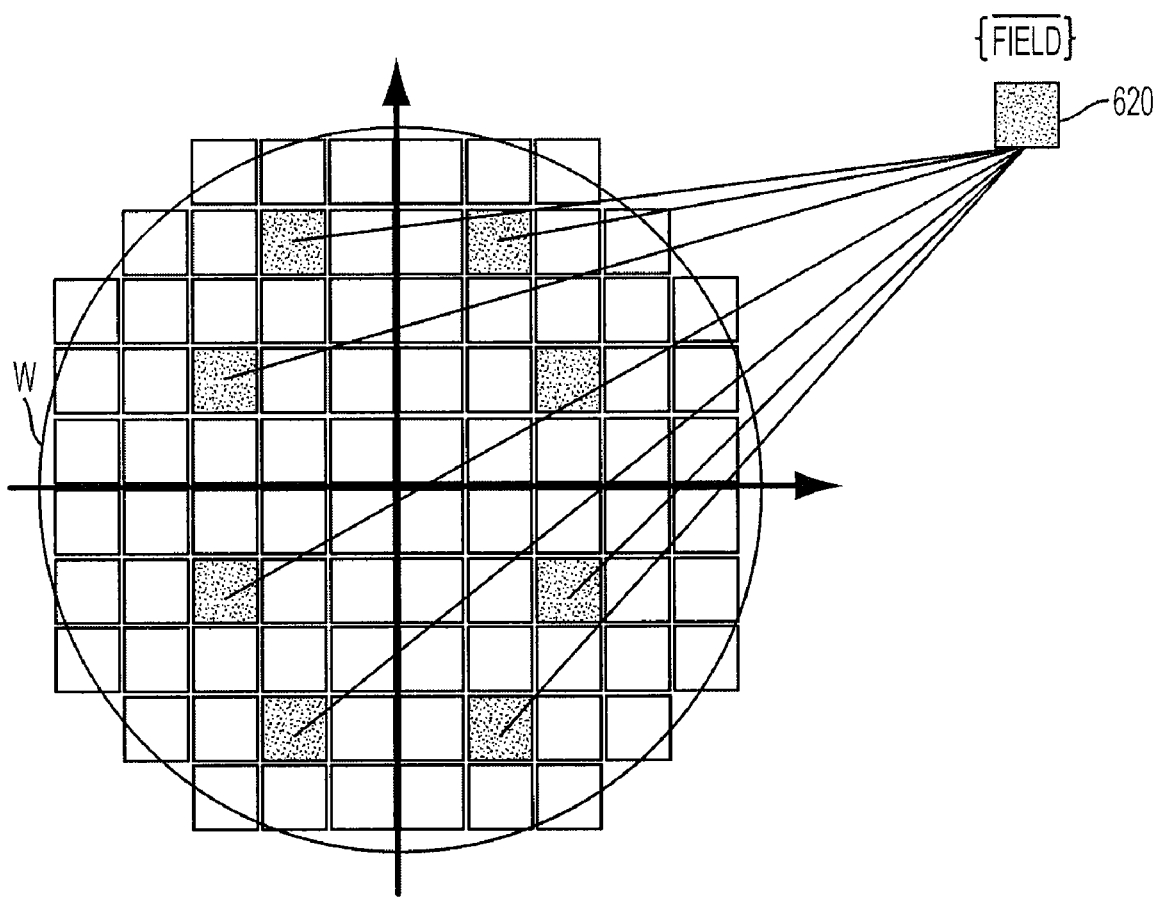
FIG. 6 depicts a plan view of a wafer that is measured by a reference sensor and a level sensor in an off-line phase to generate a set of full density map of fields of the wafer, wherein this set of full-density field maps are averaged to provide an average field.

In step 510, an average field of a wafer is obtained by using a reference sensor and a level sensor in an off-line phase. Because step 510 occurs during an off-line phase, the reference sensor and the level sensor may map the wafer at a mapping speed that is slower than a scan speed of a lithographic tool to respectively generate full-density maps of the wafer. The fields from the full-density map of the reference sensor are then averaged to provide an average field 620 of wafer W as illustrated in FIG. 6. Average field 620 is representative of high-frequency features of wafer W. As set forth above, these high-frequency features are relatively constant over the fields of wafer W and over other wafers that are processed in a similar manner to wafer W. As a result, average field 620 can be stored in a database (such as database 322 of FIG. 3), and subsequently accessed during the in-line phase to compensate for intrafield process errors of the other wafers, as explained in more detail below.

Figure 7:
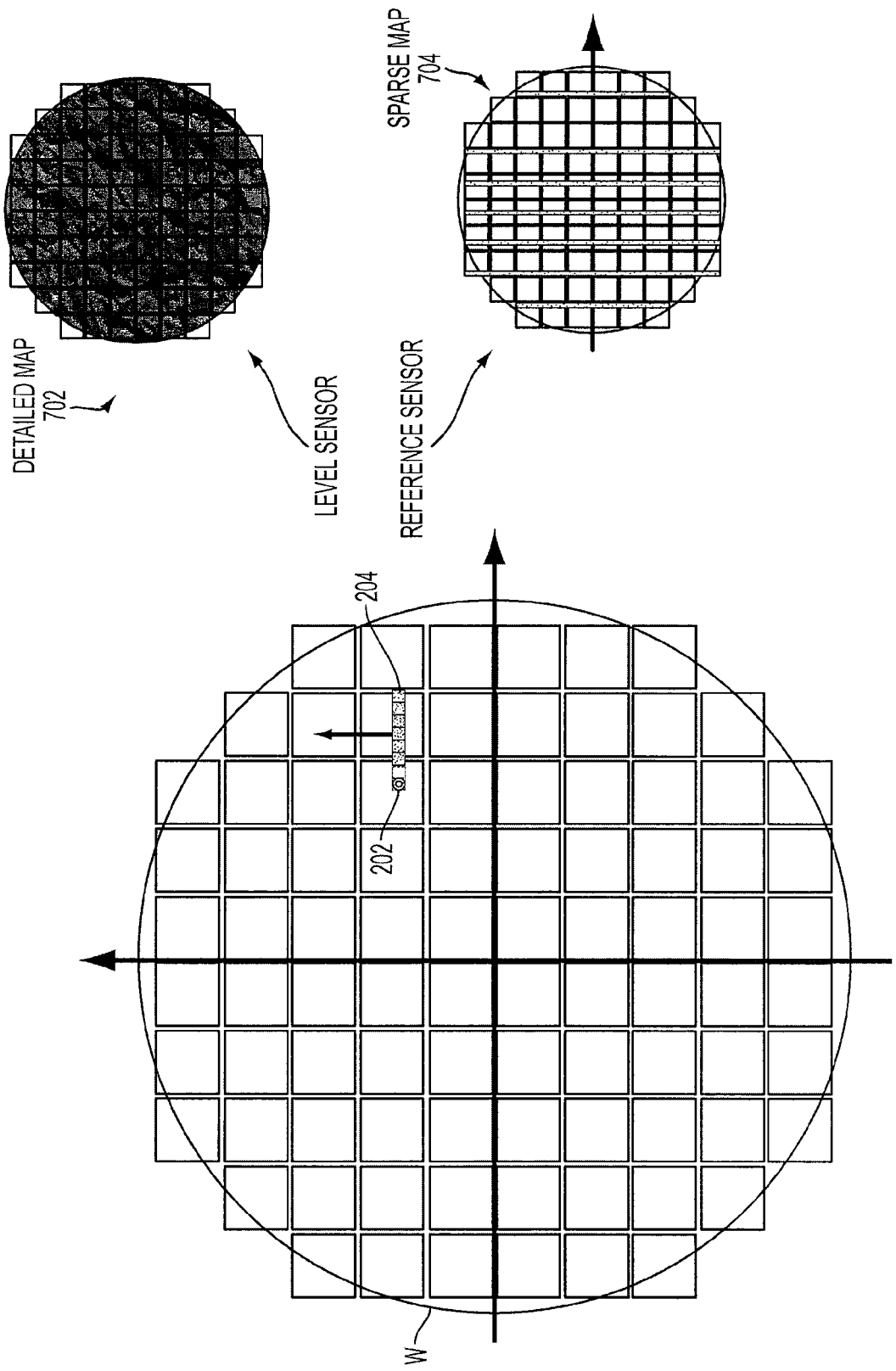
FIG. 7 depicts a plan view of a wafer that is measured by a level sensor (which generates a detailed map of the wafer) and a reference sensor (which generates a sparse map of the wafer) measured in parallel.

In step 520, which occurs during the in-line phase, a detailed map of each wafer is obtained using the level sensor, and a sparse map of each wafer is obtained using the reference sensor. For example, FIG. 7 illustrates that level sensor 204 is used to generate a detailed map 702 of wafer W and that reference sensor 202 is used to generate a sparse map 704 of wafer W. Because level sensor 204 likely interacts with underlying layers of each wafer, detailed map 702 will likely have process errors—including intrafield, interfield, and global process errors.

In step 530, a corrected map of the wafer is generated based on detailed map 702, sparse map 704, and average field 620. The intrafield process errors of detailed map 702 are compensated for in the corrected map in a different manner than the interfield, and global process errors.

Figure 8:
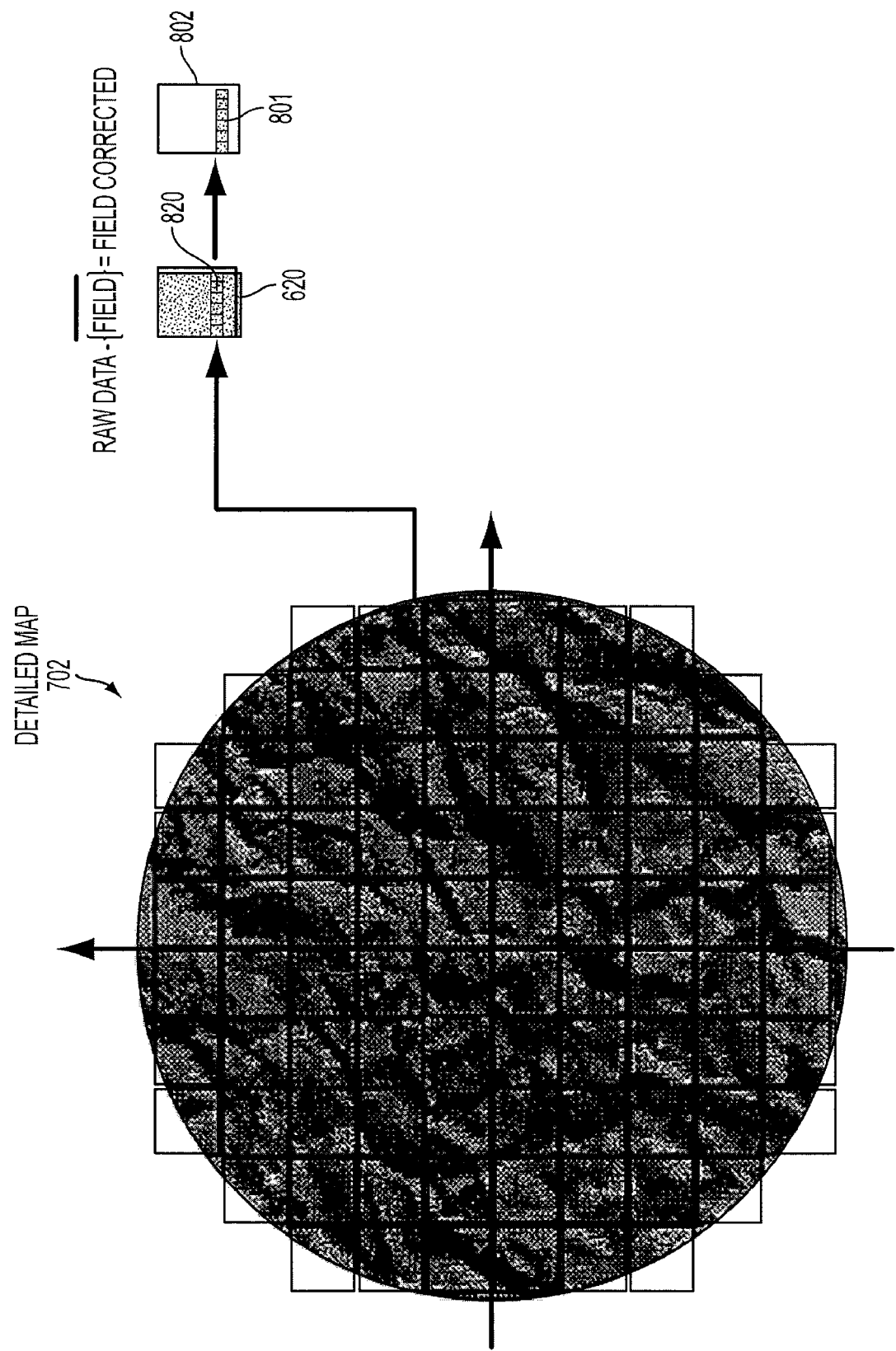
FIG. 8 illustrates the average field of FIG. 6 being subtracted from fields of the detailed map of FIG. 7 to provide a field-corrected map.
Figure 9:
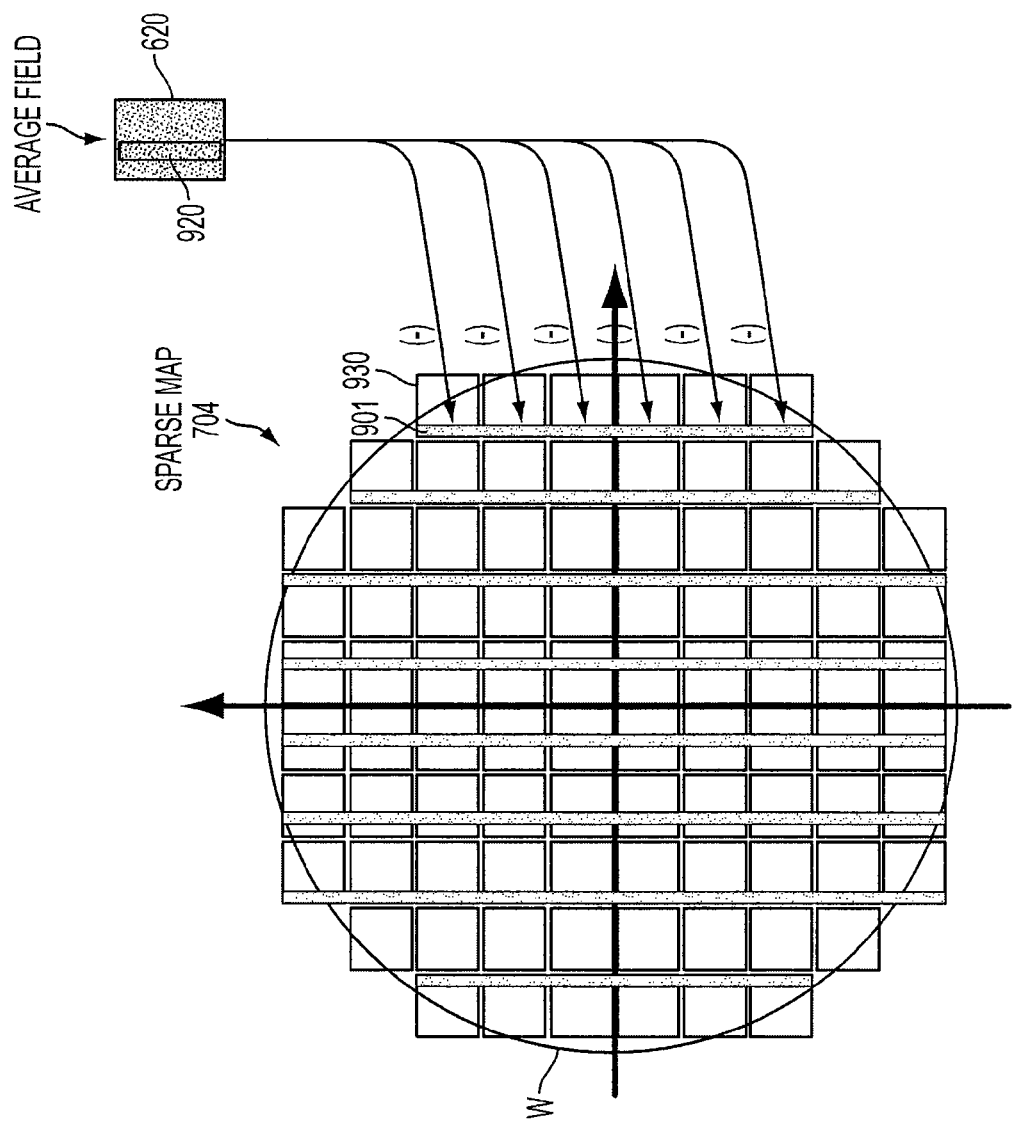
FIG. 9 illustrates the average field of FIG. 6 being subtracted from fields of the sparse map of FIG. 7 to provide a corrected sparse map.

To compensate for the intrafield process errors, average field 620 is subtracted from detailed map 702 and sparse map 704. For example, calibration module 320 may access average field 602 from database 322 and subtract average field 602 from detailed map 702 and sparse map 704. FIG. 8 illustrates that a row 820 of average field 620 is subtracted from a corresponding row of each field of detailed map 702 to obtain a row 801 of corrected field 802. This process is repeated as the level sensor scans the other rows of each field. Similarly, FIG. 9 illustrates how average field 620 is used to compensate for intrafield process errors of sparse map 704. Because the reference sensor only scans a certain track within each field of wafer W, a corresponding track of average field 620 is subtracted from each field of wafer W. For the example of FIG. 9, the reference sensor scanned a track 901 of field 930, so a corresponding track 920 of average field 620 is subtracted from field 930 to compensate for intrafield process errors of field 930. A similar subtraction process is repeated for the other fields of wafer W to obtain a corrected-sparse map 1004.

Figure 10:
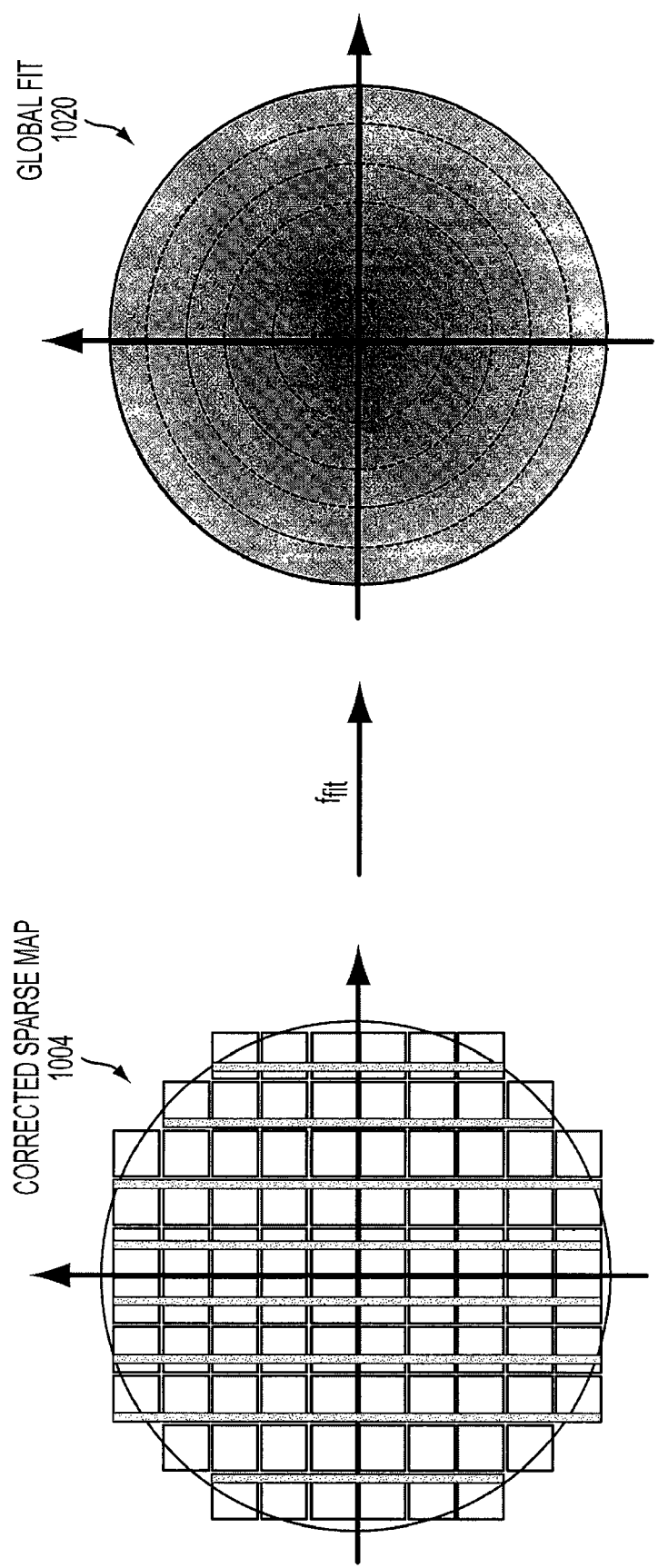
FIG. 10 illustrates a mathematical fit being applied to a corrected sparse map to provide a global fit that represents wafer scale process errors.
Figure 11:
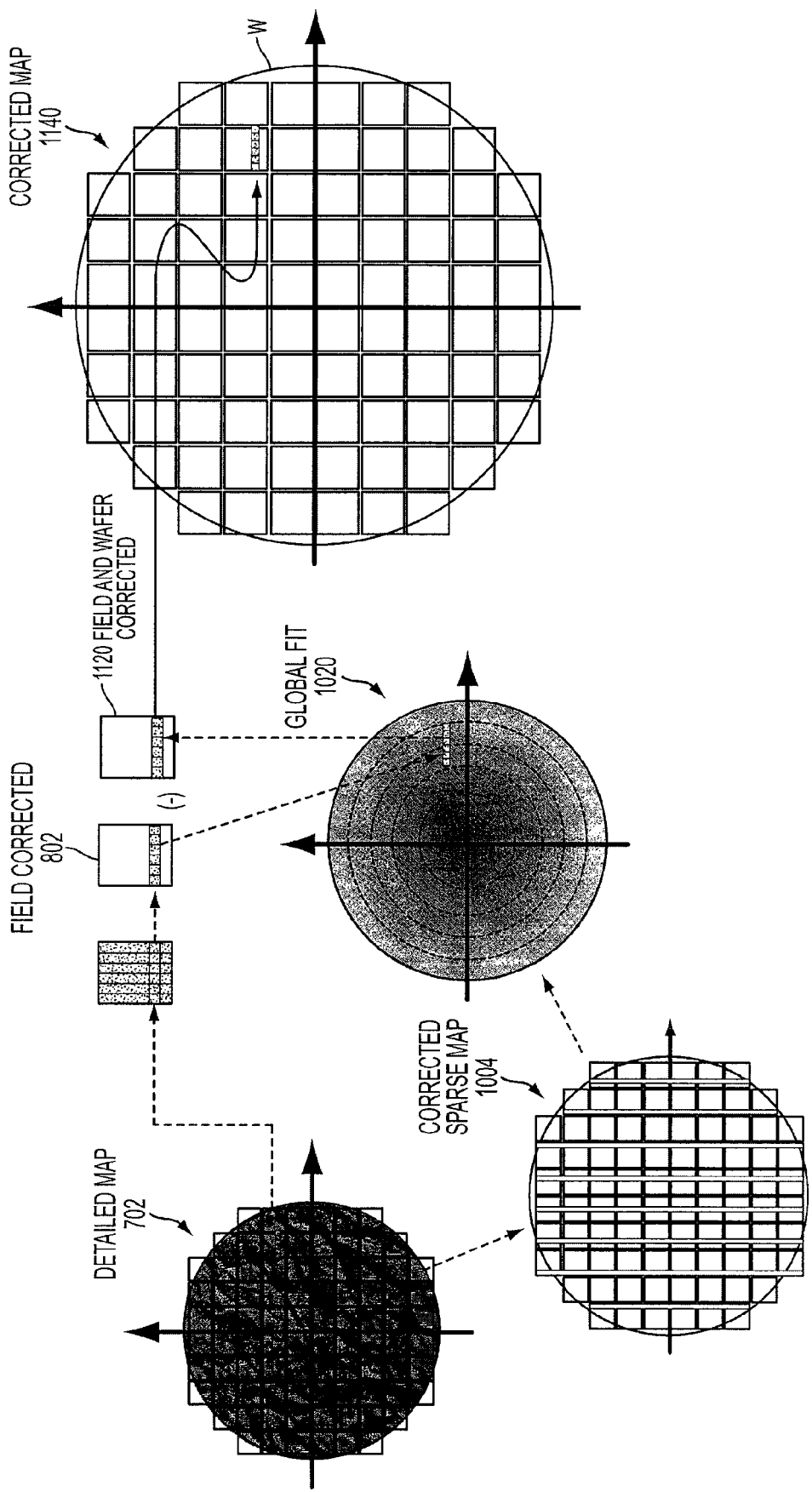
FIG. 11 illustrates the global fit of FIG. 10 being subtracted from the field-corrected map of FIG. 8 to provide a field- and wafer-corrected map.

To compensate for the interfield and global process errors, first, a mathematical fit (such as, for example, a Zernike fit) is applied to field corrected-sparse map 1004 to generate a global fit 1020 as illustrated in FIG. 10. Global fit 1020 is representative of interfield and global process errors. Then, as illustrated in FIG. 11, each field of global fit 1020 is subtracted from corresponding corrected fields 802 to obtain field- and wafer-corrected fields 1120. The field- and wafer-corrected fields 1120 are used to generate a corrected map 1140 of wafer W. Thus, a given field of detailed map 702 is compensated for by average field 620 and a lookup into global fit 1020 to create a intrafield and interfield corrected map 1140.

Thus, the intrafield, interfield, and global process errors of detailed map 702 are compensated for to obtain corrected map 1140. Corrected map 1140 is used to determine focus-positioning parameters of an exposure system.

B. An Example One-Phase Method

Figure 12:
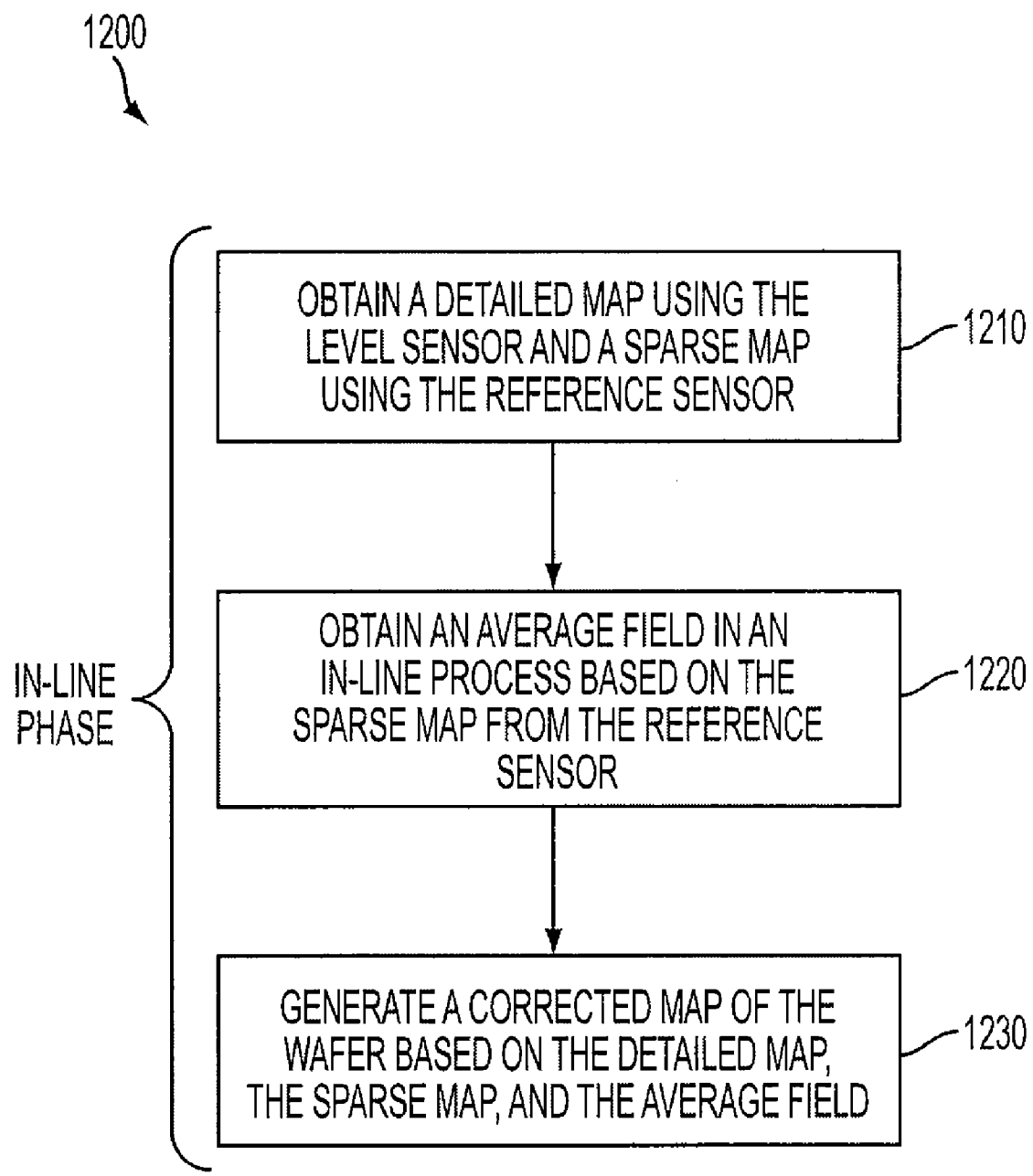
FIG. 12 depicts a flow diagram illustrating an example one-phase method for compensating for process errors of a level sensor.

FIG. 12 depicts a flow diagram 1200 illustrating an overview of an example one-phase method to compensate for process errors in a lithography tool. In particular, this example method includes only an in-line phase during which steps 1210, 1220, and 1230 occur. FIGS. 13-20 illustrate various aspects of the in-line phase of the method of FIG. 12. The example method of FIG. 12 may be implemented, for example, when the scan speed of a reference sensor is commensurate with the desired throughput of a lithographic apparatus. This example method is described in more detail below.

Figure 13:
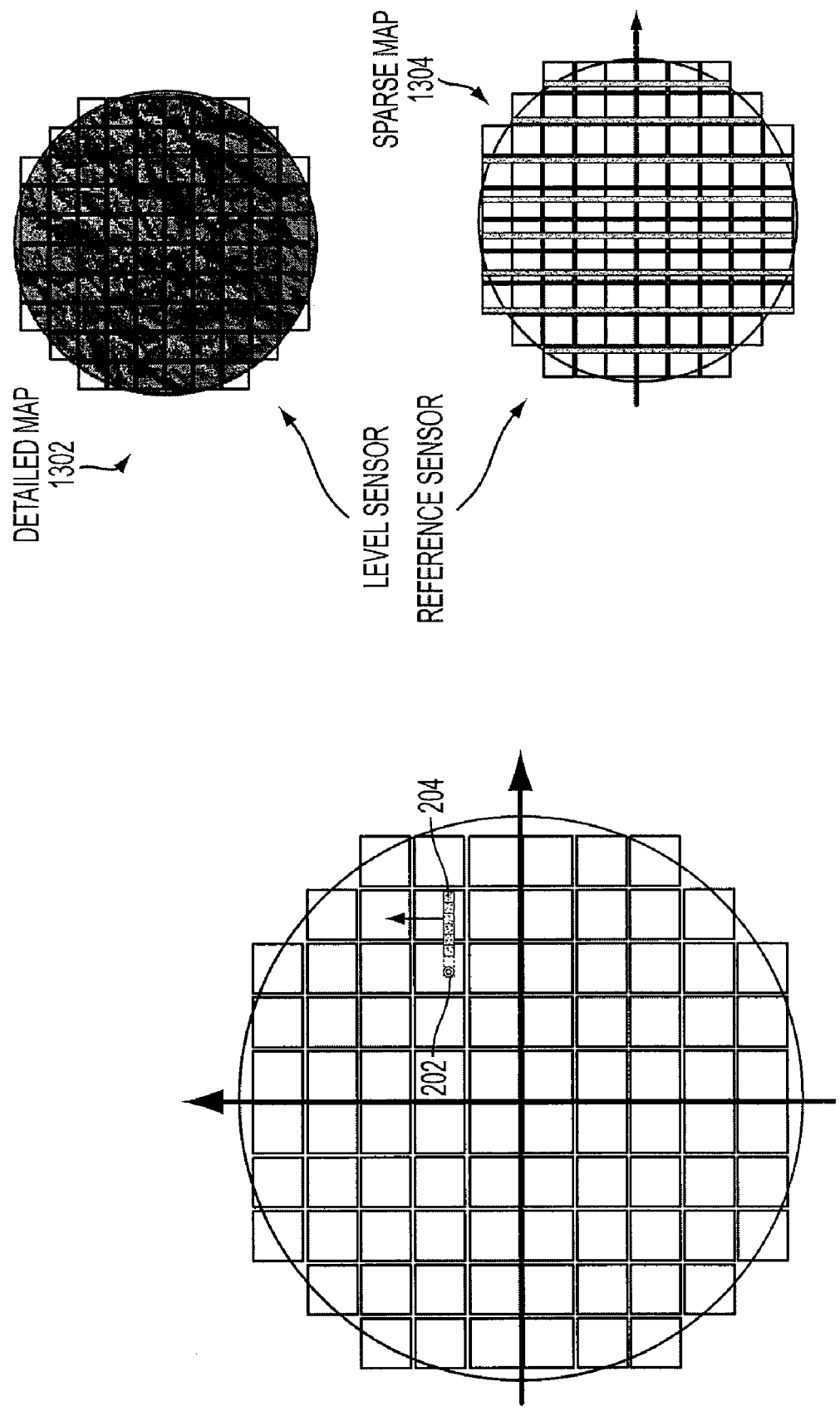
FIG. 13 depicts a plan view of a wafer that is measured by a level sensor (which generates a detailed map of the wafer) and a reference sensor (which generates a sparse map of the wafer).

In step 1210, which occurs during the in-line phase, a detailed map of each wafer is obtained using the level sensor, and a sparse map of each wafer is obtained using the reference sensor. For example, FIG. 13 illustrates that level sensor 204 is used to generate a detailed map 1302 of wafer W and that reference sensor 202 is used to generate a sparse map 1304 of wafer W. Because level sensor 204 likely interacts with underlying layers of each wafer, detailed map 1302 will likely have process errors-including intrafield, interfield, and global process errors.

Figure 14A:
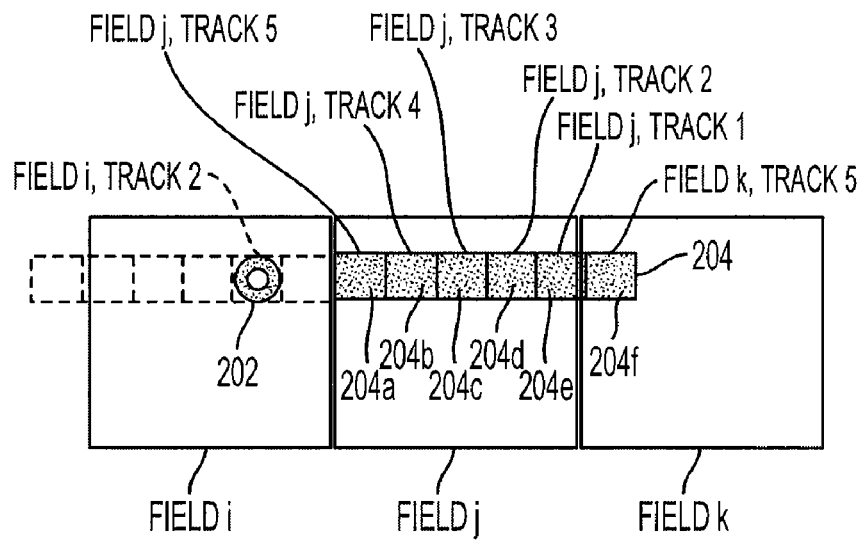
FIGS. 14A and 14B depict example fields of a wafer, wherein the example fields are divided into tracks which are processed by a reference sensor and a level sensor.
Figure 14B:
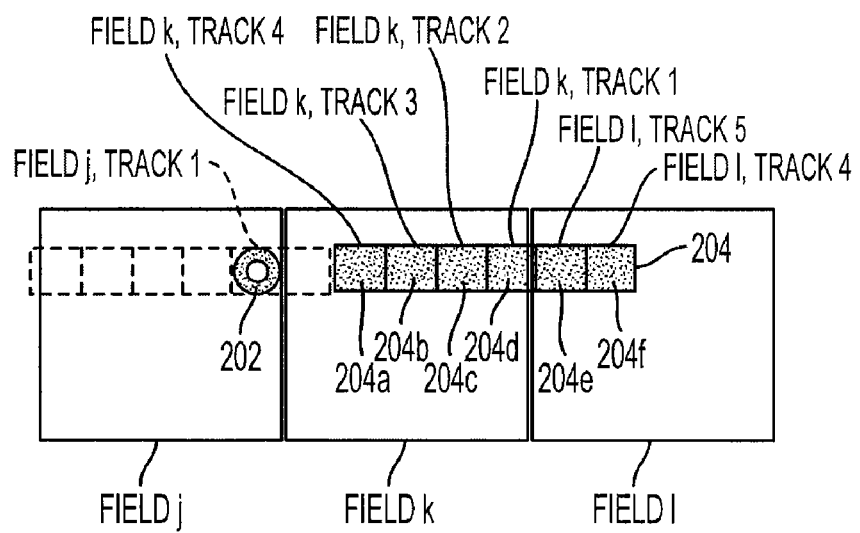
Figure 15:
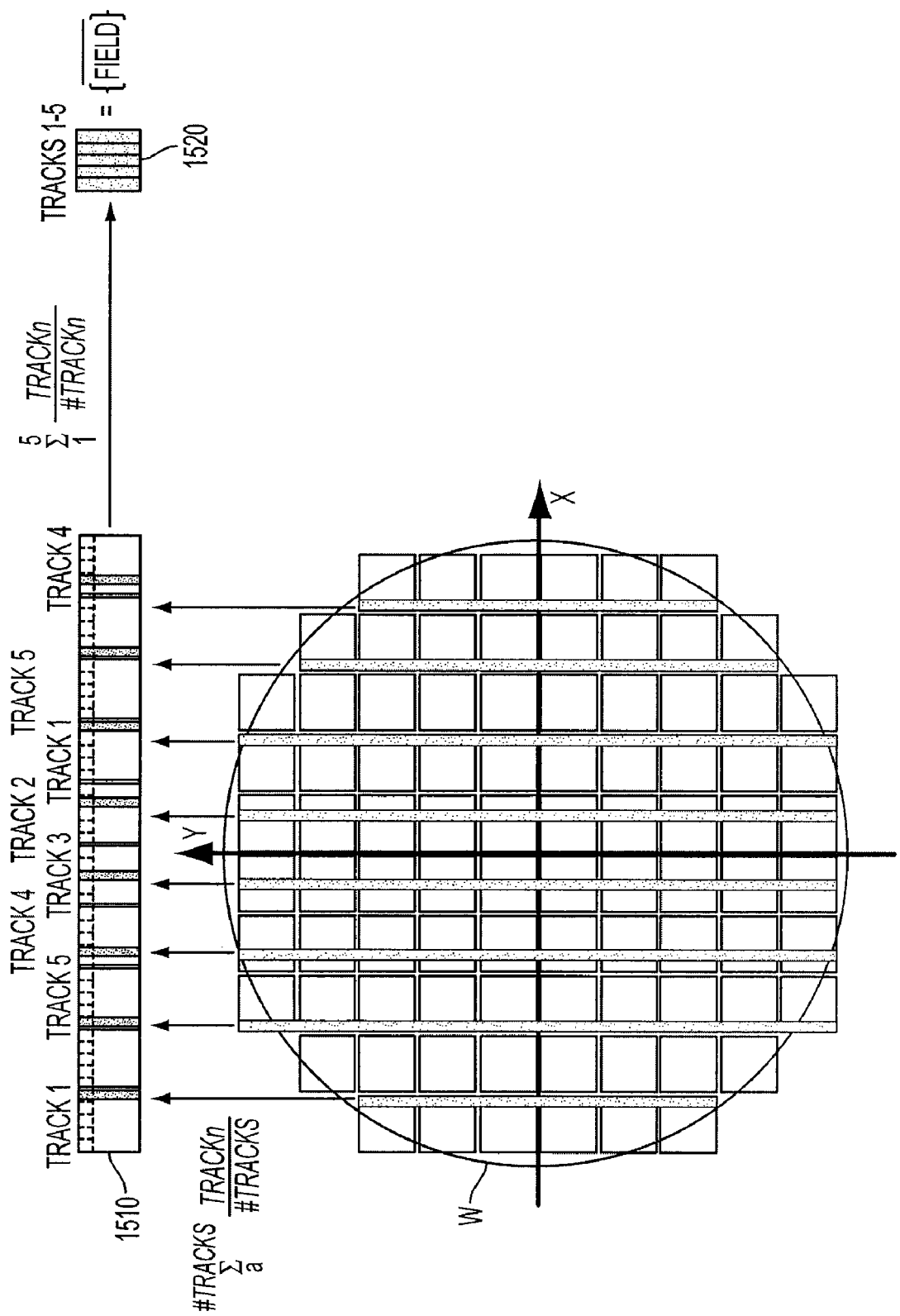
FIG. 15 depicts a sparse map acquired in such a manner that allows for the average field to be extracted from the tracks of FIG. 14 to obtain an average field.

In step 1220, an average field of a wafer is obtained based on sparse map 1304 from reference sensor 202. Because step 1220 occurs during the in-line phase, the reference sensor should map the wafer at a mapping speed that is commensurate with a scan speed of a lithographic tool. To map the wafer at this speed, in an embodiment the reference sensor only scans certain tracks of each field, as illustrated in FIGS. 14A-B and 15. The wafer is scanned in such a manner that provides that all the tracks of the fields are sampled.

Referring to FIG. 14A, while level sensor 204 scans tracks 1-5 of field j and track 1 of field k along a first direction (e.g., Y direction), reference sensor only scans track 2 of field i along that first direction. FIG. 14B illustrates that, while level sensor 204 scans tracks 1-4 of field k and tracks 4 and 5 of field l, reference sensor 202 only scans track 1 of field j.

Thus, as illustrated in FIG. 15, reference sensor 202 only scans certain tracks of each field of wafer W. First, the tracks from each field are averaged in a first direction (e.g., Y direction) to obtain average tracks 1510. Second, all the track 1 data is averaged, all the track 2 data is averaged, all the track 3 data is averaged, and so on. Then, the average of tracks 1-5 are combined to obtain average field 1520. Although average field 1520 is not mathematically equivalent to average field 620, average field 1520—like average field 620—is representative of high-frequency features of wafer W. As set forth above, these high-frequency features are relatively constant over the fields of wafer W and over other wafers that are processed in a similar manner to wafer W. As a result, average field 1520 can be stored in a database (such as database 322 of FIG. 3) or temporary storage (such as main memory or cache memory), and subsequently accessed to compensate for intrafield process errors of the other wafers, as explained in more detail below.

Referring again to FIG. 12, in step 1230 a corrected map of the wafer is generated based on detailed map 1302, sparse map 1304, and average field 1520. The intrafield process errors of detailed map 1302 are compensated for in the corrected map in a different manner than the interfield, and global process errors.

Figure 16:
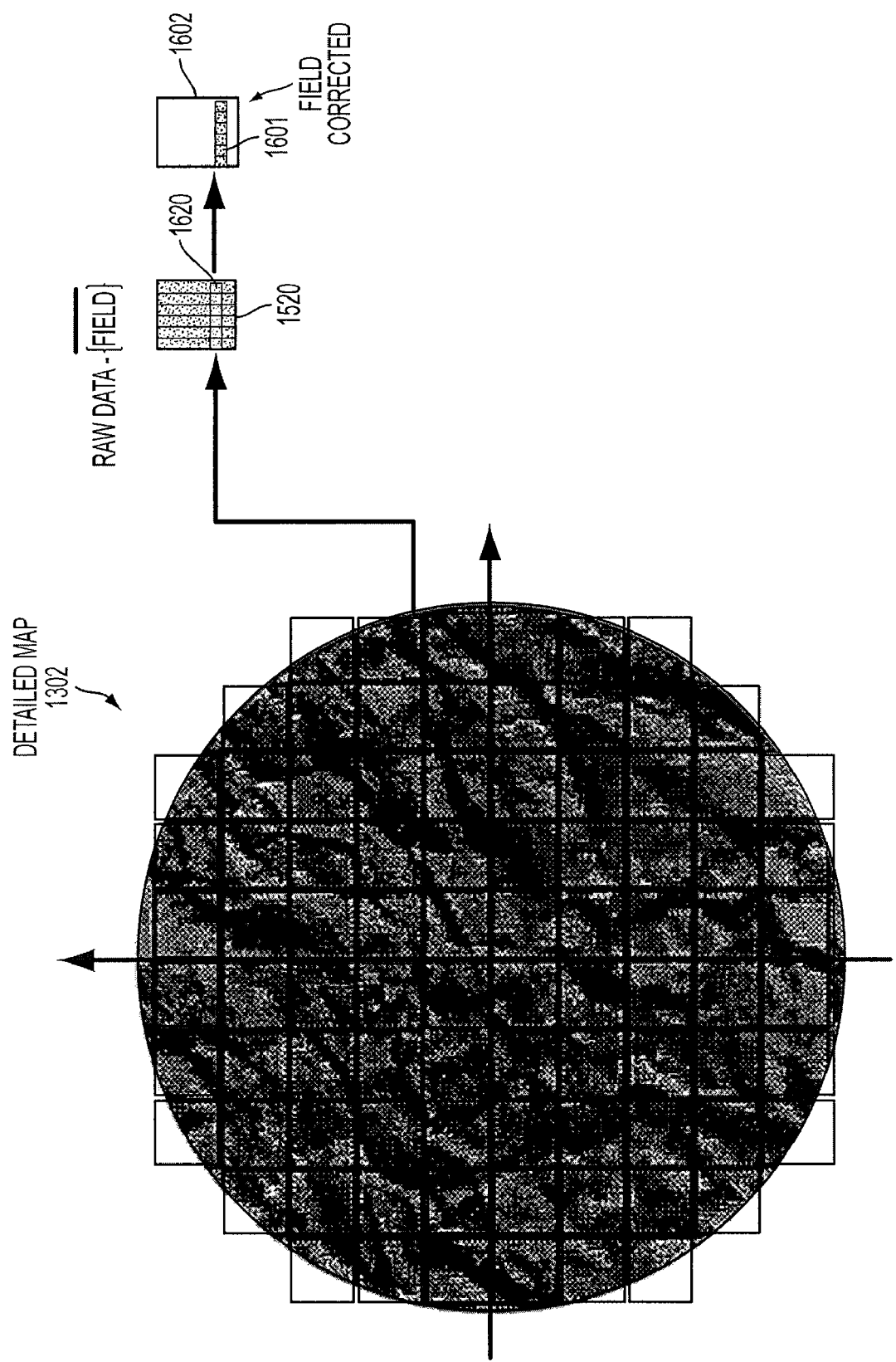
FIG. 16 depicts the average field of FIG. 15 being subtracted from fields of the detailed map of FIG. 13 to provide a field-corrected map.
Figure 17:
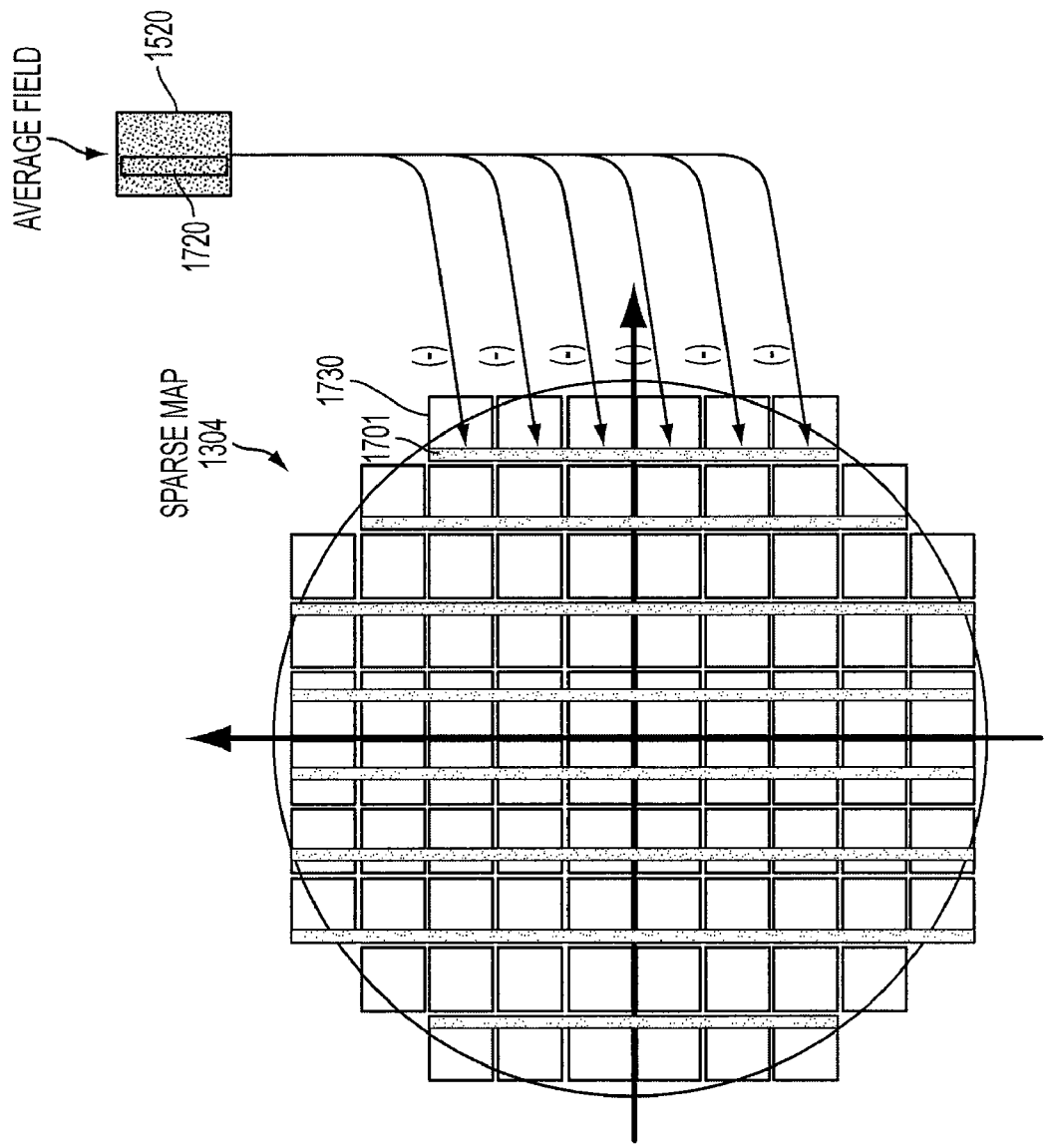
FIG. 17 depicts the average field of FIG. 15 being subtracted from fields of the sparse map of FIG. 13 to provide a corrected sparse map.

To compensate for the intrafield process errors, average field 1520 is subtracted from detailed map 1302 and sparse map 1304. For example, calibration module 320 may access average field 1602 from database 322 or temporary storage and subtract average field 1602 from detailed map 1302 and sparse map 1304. FIG. 16 illustrates that a row 1620 average field 1520 is subtracted from a corresponding row of each field of detailed map 1302 to obtain a row 1601 of corrected field 1602. This process is repeated as the level sensor scans the other rows of each field. Similarly, FIG. 17 illustrates how average field 1520 is used to compensate for intrafield process errors of sparse map 1304. Because the reference sensor only scans a certain track within each field of wafer W, a corresponding track of average field 1520 is subtracted from each field of wafer W. For the example of FIG. 17, the reference sensor scans a track 1701 of field 1730, so a corresponding track 1720 of average field 1520 is subtracted from field 1730 to compensate for intrafield process errors of field 1730. A similar subtraction process is repeated for the other fields of wafer W to obtain corrected sparse map 1804.

Figure 18:
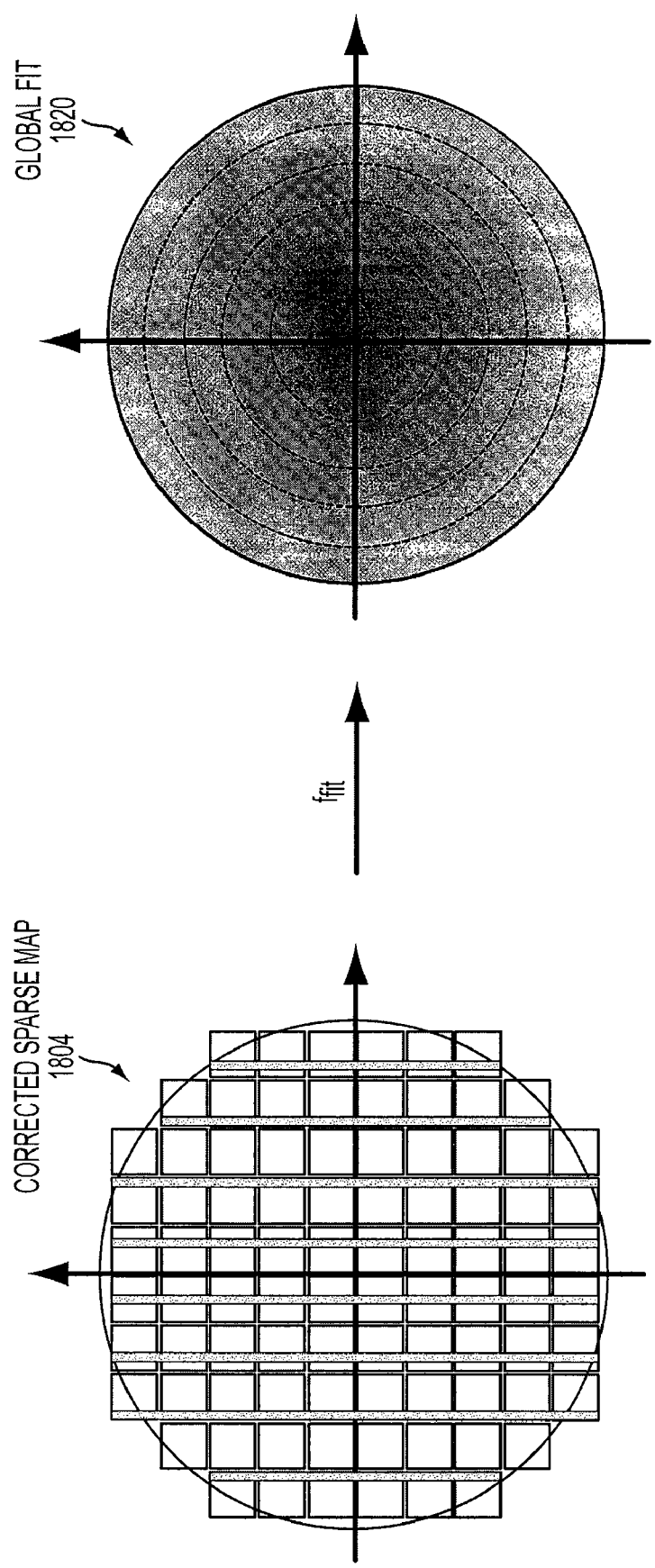
FIG. 18 illustrates a mathematical fit being applied to a corrected sparse map to provide a global fit that represents wafer scale process errors.
Figure 19:
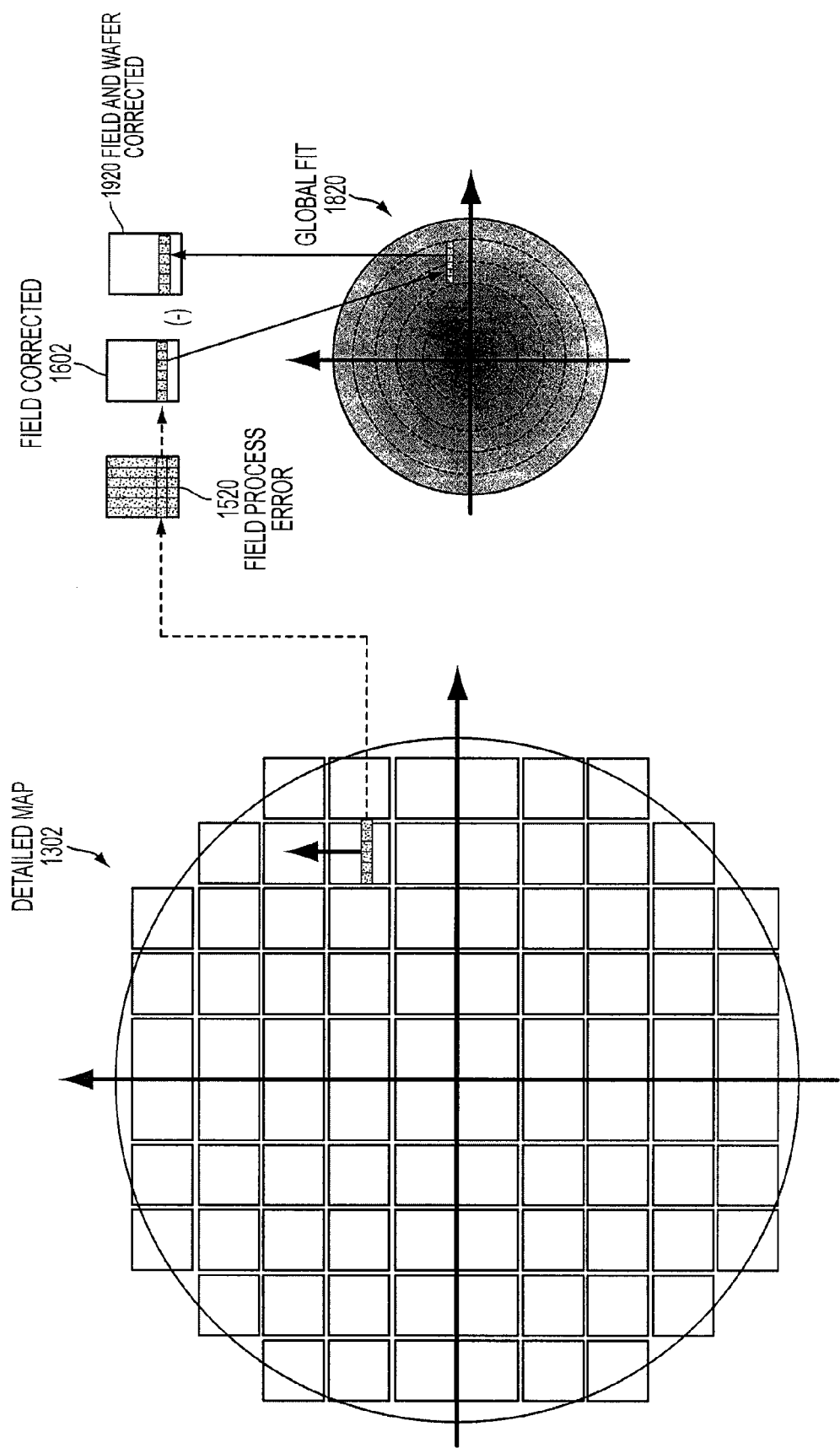
FIGS. 19 and 20 illustrate the global fit of FIG. 18 being subtracted from the field-corrected map of FIG. 16 to provide a field- and wafer-corrected fields which are mapped to appropriate fields of a wafer to generate a field- and wafer-corrected map.
Figure 20:
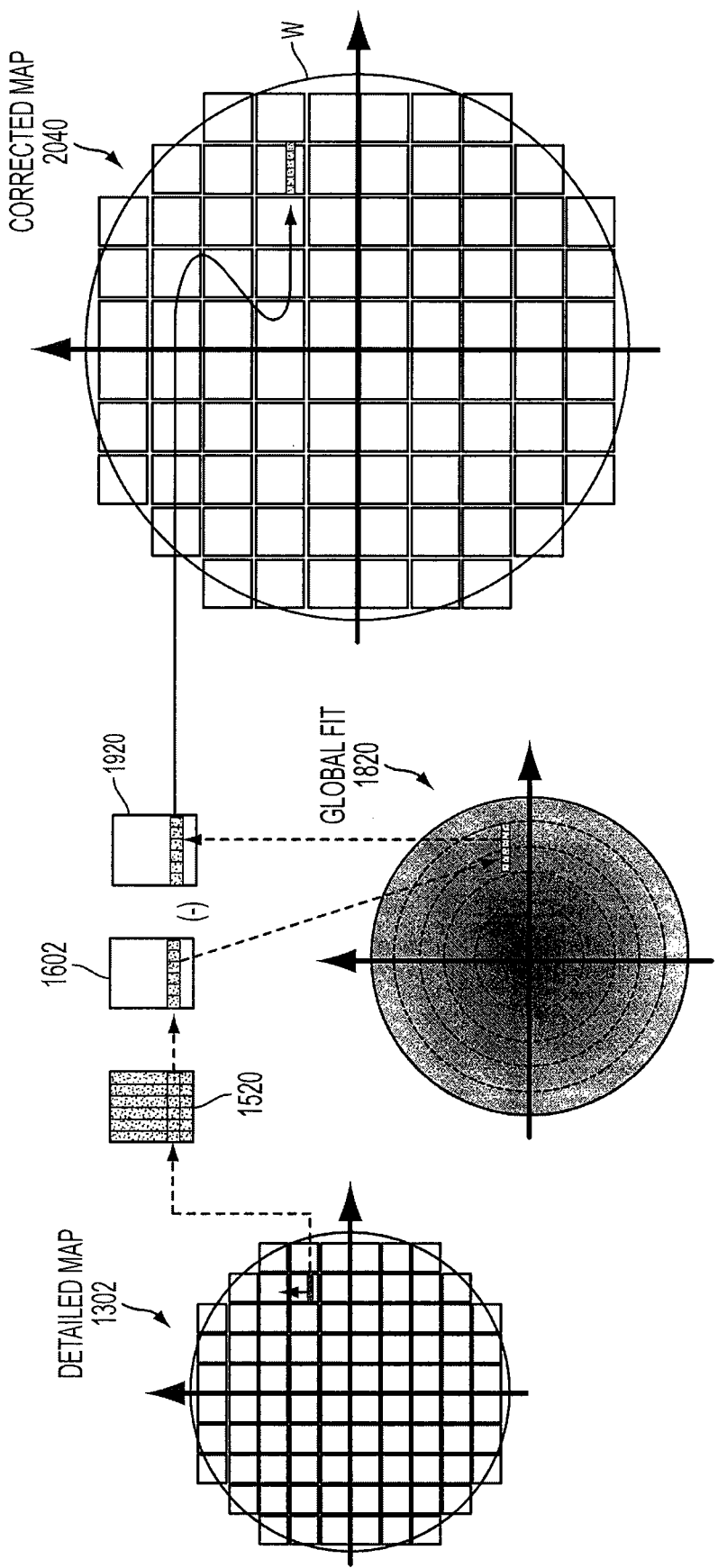

To compensate for the interfield and global process errors, first, a mathematical fit (such as, for example, a Zernike fit) is applied to corrected-sparse map 1804 to generate a global fit 1820 as illustrated in FIG. 18. Global fit 1820 is representative of interfield and global process errors. Then, as illustrated in FIG. 19, each field of global fit 1820 is subtracted from corresponding corrected fields 1602 to obtain field- and wafer-corrected fields 1920. FIG. 20 illustrates that each field- and wafer-corrected field 1920 is used to generate a corrected map 2040 of wafer W.

Thus, the intrafield, interfield, and global process errors of detailed map 1302 are compensated for to obtain corrected map 2040. Corrected map 2040 is used to determine focus-positioning parameters of an exposure system.

IV. Example Computer Implementation for Parallel Process Focus Compensation

Figure 21:
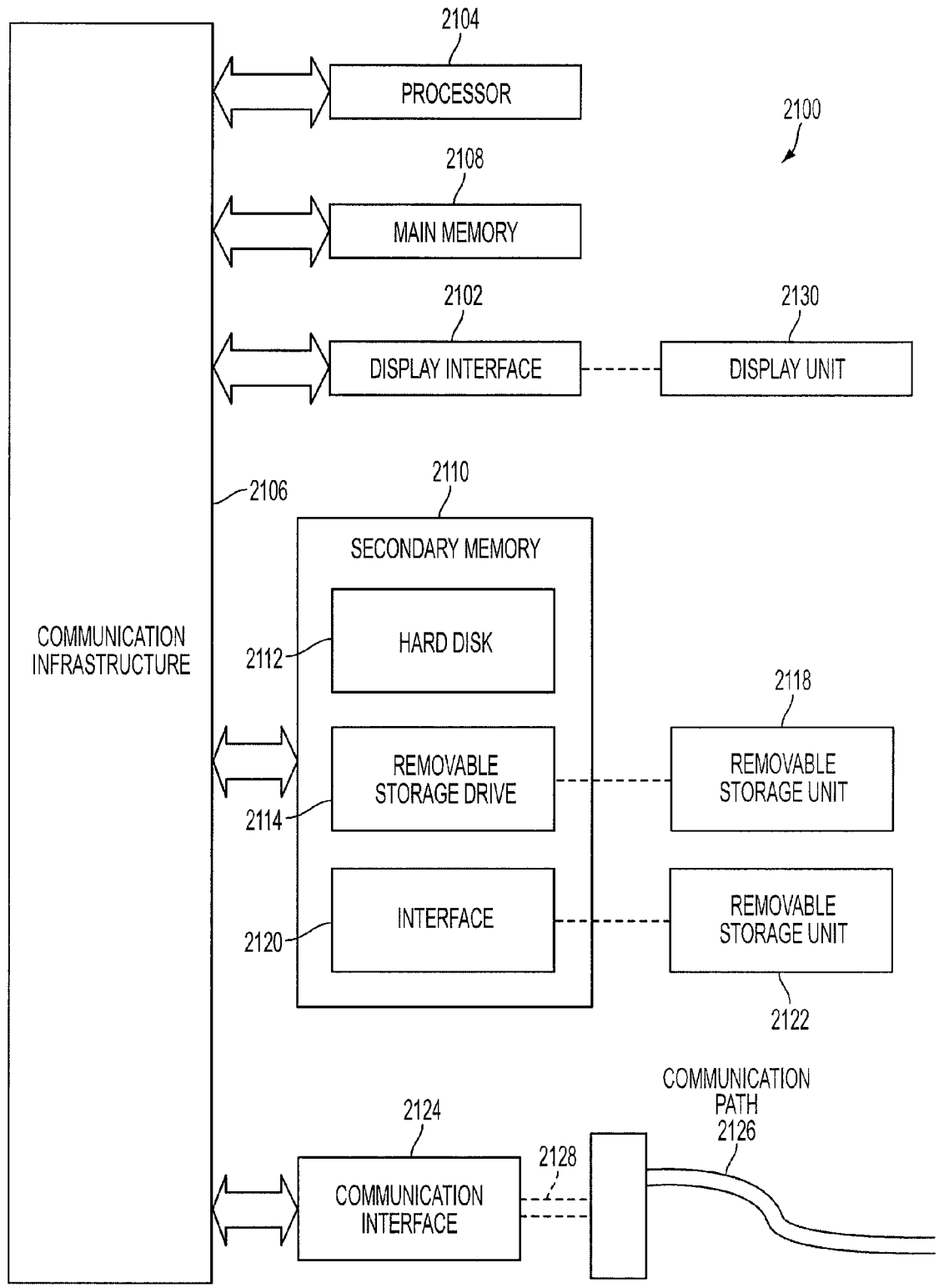
FIG. 21 depicts an example computer system for implementing embodiments of the present invention.

Embodiments of the present invention may be implemented using hardware, software or a combination thereof, and may be implemented in one or more computer systems or other processing systems. An example of a computer system 2100 is shown in FIG. 21.

The computer system 2100 includes one or more processors, such as processor 2104. Processor 2104 may be a general purpose processor (such as, a CPU) or a special purpose processor (such as, a GPU). Processor 2104 is connected to a communication infrastructure 2106 (e.g., a communications bus, cross-over bar, or network). Various software embodiments (such as, for example, calibration module 320) are described in terms of this exemplary computer system. After reading this description, it will become apparent to a person skilled in the relevant art(s) how to implement the invention using other computer systems and/or architectures.

Computer system 2100 (optionally) includes a display interface 2102 that forwards graphics, text, and other data from communication infrastructure 2106 (or from a frame buffer not shown) for display on display unit 2130.

Computer system 2100 also includes a main memory 2108, preferably random access memory (RAM), and may also include a secondary memory 2110 (which may include database 322). The secondary memory 2110 may include, for example, a hard disk drive 2112 and/or a removable storage drive 2114, representing a floppy disk drive, a magnetic tape drive, an optical disk drive, etc. The removable storage drive 2114 reads from and/or writes to a removable storage unit 2118 in a well known manner. Removable storage unit 2118 represents a floppy disk, magnetic tape, optical disk, etc. which is read by and written to by removable storage drive 2114. As will be appreciated, the removable storage unit 2118 includes a computer-readable storage medium having stored therein computer software and/or data.

In alternative embodiments, secondary memory 2110 may include other similar devices for allowing computer programs or other instructions to be loaded into computer system 2100. Such devices may include, for example, a removable storage unit 2122 and an interface 2120. Examples of such may include a program cartridge and cartridge interface, a removable memory chip (such as an erasable programmable read only memory (EPROM), or programmable read only memory (PROM)) and associated socket, and other removable storage units 2122 and interfaces 2120, which allow software and data to be transferred from the removable storage unit 2122 to computer system 2100.

Computer system 2100 may also include a communications interface 2124. Communications interface 2124 allows software and data to be transferred between computer system 2100 and external devices. Examples of communications interface 2124 may include a modem, a network interface (such as an Ethernet card), a communications port, a Personal Computer Memory Card International Association (PCM-CIA) slot and card, etc. Software and data transferred via communications interface 2124 are in the form of signals 2128 which may be electronic, electromagnetic, optical or other signals capable of being received by communications interface 2124. These signals 2128 are provided to communications interface 2124 via a communications path (e.g., channel) 2126. This channel 2126 carries signals 2128 and may be implemented using wire or cable, fiber optics, a telephone line, a cellular link, an radio frequency (RF) link and other communications channels.

In this document, the terms "computer program medium" and "computer-readable storage medium" are used to generally refer to media such as removable storage drive 2114 and a hard disk installed in hard disk drive 2112. These computer program products provide software to computer system 2100.

Computer programs (also referred to as computer control logic) are stored in main memory 2108 and/or secondary memory 2110. Computer programs may also be received via communications interface 2124. Such computer programs, when executed, enable the computer system 2100 to perform features of the present invention, such as compensating for process errors in a lithographic tool as discussed herein. In particular, the computer programs, when executed, enable the processor 2104 to perform the features of the present invention, including the implementation of the methods illustrated in FIGS. 4, 5, and 12 and discussed herein. Accordingly, such computer programs represent controllers of the computer system 2100.

V. Conclusion

Described above are embodiments of parallel process focus compensation. It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc.

Although specific reference may have been made above to the use of embodiments of the invention in the context of optical lithography, it will be appreciated that the invention may be used in other applications, for example imprint lithography, and where the context allows, is not limited to optical lithography.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A method of compensating for process errors in a lithography tool, comprising:
    measuring at least one feature of a first surface of a wafer at a desired mapping speed and at a desired accuracy with a first sensor to selectively map a topography of the wafer;
    measuring the wafer in parallel with the measuring of the at least one feature with a second sensor to determine focus-positioning parameters of an exposure system;
    calibrating one or more sources of the process errors in the focus-positioning parameters associated with the second sensor using the at least one feature of the first surface measured using the first sensor;
    measuring a first full-density field map of the wafer with the first sensor to obtain first-sensor data; and
    measuring a second full-density field map of the wafer with the second sensor to obtain second-sensor data for determining an intrafield error.

2. The method of claim 1, wherein measuring the at least one feature comprises:
    providing for the first sensor an air gauge as a reference sensor to accurately measure at least one of a fine feature of the first surface of the wafer which repeats each printed field or a coarse feature which is on a scale of a size of the wafer.

3. The method of claim 1, wherein measuring the wafer comprises:
providing for the second sensor an optical sensor or a capacitance sensor as a level sensor.

4. The method of claim 1, further comprising:
subtracting the first-sensor data from the second-sensor data to measure a process error associated with the second sensor.

5. The method of claim 4, further comprising:
generating a plurality of field process-error maps based on the first-sensor data and the second-sensor data;
averaging the plurality of field process-error maps into an average-field map; and
storing the average-field map.

6. The method of claim 1, wherein measuring a first full-density field map of the wafer further comprises:
measuring the first full-density field map and the second full-density field map at a mapping speed relatively slower than a nominal-mapping speed of the first and second sensors and a scanning speed relatively slower than a nominal-scanning speed of the first and second sensors.

7. The method of claim 1, further comprising:
providing a field layout with columns on the wafer for scanning the topography of the wafer in the columns.

8. A method of compensating for process errors in a lithography tool, comprising:
measuring at least one feature of a first surface of a wafer at a desired mapping speed and at a desired accuracy with a first sensor to selectively map a topography of the wafer;
measuring the wafer in parallel with the measuring of the at least one feature with a second sensor to determine focus-positioning parameters of an exposure system;
calibrating one or more sources of the process errors in the focus-positioning parameters associated with the second sensor using the at least one feature of the first surface measured using the first sensor; and
measuring the wafer with an air gauge as the first sensor and a level sensor as the second sensor during an in-line phase at a full-mapping speed such that the air gauge creates a sparse-topographic map of the wafer from first-sensor data and the level sensor creates a detailed-topographic map from second-sensor data.

9. The method of claim 8, further comprising:
averaging a plurality of field process error-maps created from the first- and second-sensor data to generate a stored average-field map; and
subtracting the stored average-field map from the sparse-topographic map to provide a corrected sparse-topographic map.

10. The method of claim 9, further comprising:
applying a global fit to the corrected sparse-topographic map, wherein the global fit is based on one or more wafer-scale process errors.

11. The method of claim 9, further comprising:
subtracting the stored average-field map from each respective spot reading of the level sensor to provide a field-corrected second-sensor data.

12. The method of claim 11, further comprising:
reconstructing a process-corrected wafer-topographic map using the field-corrected second-sensor data.

13. The method of claim 8, wherein the air gauge as the first sensor and the level sensor as the second sensor each have a desired full bandwidth.

14. The method of claim 13, further comprising:
providing a field layout with columns on the wafer for scanning the topography of the wafer in the columns;
dividing the fields in the columns into tracks including vertical tracks; and
acquiring scans in the vertical tracks processing the fields as defined by a customer.

15. The method of claim 14, wherein acquiring scans in the vertical tracks processing the fields further comprises:
scanning the wafer with the first sensor to acquire a map of an average field and a sparse map of interfield errors.

16. The method of claim 15, further comprising:
subtracting an error from the averaged-field process-error map from each respective spot reading of the level sensor based on a location within a field; and
storing the averaged-field process-error map to provide a stored averaged-field process-error map.

17. The method of claim 16, further comprising:
subtracting the stored average-field process-error map from a sparse-topographic map of the wafer created using the first-sensor data from the air gauge to provide field-corrected data.

18. The method of claim 17, further comprising:
applying a global fit to the corrected sparse-topographic map, wherein the global fit is based on one or more wafer-scale process errors.

19. The method of claim 18, further comprising:
performing a lookup of corrections in the global fit based on locations of original spots of the wafer to provide field- and wafer-corrected data.

20. The method of claim 19, further comprising:
using the field-corrected data to reconstruct a process-corrected wafer-topographic map.

21. A system of correcting process errors in a lithography tool, comprising:
a first sensor configured to sense a first surface of a wafer to generate a first topographic map of the first surface of the wafer;
a second sensor configured to sense the first surface of the wafer in parallel with the first sensor to generate a second topographic map of the first surface of the wafer, wherein the second map is used for determining focus-positioning parameters of an exposure system; and
a calibration module configured to calibrate the focus-positioning parameters of the exposure system based on the first and second topographic maps, wherein:
the first sensor is configured to sense the first surface of the wafer to obtain first-sensor data in an off-line phase, wherein the first-sensor data comprises a first full-density field map of the first surface of the wafer;
the second sensor is configured to sense the first surface of the wafer to obtain second-sensor data in an off-line phase, wherein the second-sensor data comprises a second full-density field map of the first surface of the wafer; and
the calibration module is configured to determine an intrafield error based on the first- and second-sensor data.

22. The system of claim 21, wherein the first sensor comprises an air gauge configured to accurately measure at least one of a fine feature of the first surface of the wafer which repeats each printed field or a coarse feature which is on a scale of a size of the wafer.

23. The system of claim 21, wherein the second sensor comprises an optical sensor or a capacitance sensor.

24. A system of correcting process errors in a lithography tool, comprising:
- a first sensor configured to sense a first surface of a wafer to generate a first topographic map of the first surface of the wafer;
- a second sensor configured to sense the first surface of the wafer in parallel with the first sensor to generate a second topographic map of the first surface of the wafer, wherein the second map is used for determining focus-positioning parameters of an exposure system; and
- a calibration module configured to calibrate the focus-positioning parameters of the exposure system based on the first and second topographic maps, wherein:
- the first sensor is configured to sense the first surface of the wafer to obtain first-sensor data in an in-line phase, wherein the first-sensor data comprises a sparse-topographic map of the first surface of the wafer; and
- the second sensor is configured to sense the first surface of the wafer to obtain second-sensor data in the in-line phase, wherein the second-sensor data comprises a detailed-topographic map of the first surface of the wafer.

25. A computer-program product comprising a non-transitory computer-readable storage medium having control logic stored therein for causing a computer to correct process errors in a lithography tool, the control logic comprising:
- first computer-readable program code for causing the computer to receive first-sensor data, wherein the first-sensor data comprises a first-topographic map of a wafer sensed by a first sensor;
- second computer-readable program code for causing the computer to receive second-sensor data wherein the second-sensor data comprises a second-topographic map of the wafer sensed by a second sensor in parallel with the first sensor; and
- third computer-readable program code for causing the computer to calibrate focus-positioning parameters of an exposure system based on the first- and second-sensor data, wherein the first- and second-sensor data respectively comprise first and second full-density topographic maps obtained in an off-line phase.

26. A computer-program product comprising a non-transitory computer-readable storage medium having control logic stored therein for causing a computer to correct process errors in a lithography tool, the control logic comprising:
- first computer-readable program code for causing the computer to receive first-sensor data, wherein the first-sensor data comprises a first-topographic map of a wafer sensed by a first sensor;
- second computer-readable program code for causing the computer to receive second-sensor data, wherein the second-sensor data comprises a second-topographic map of the wafer sensed by a second sensor in parallel with the first sensor; and
- third computer-readable program code for causing the computer to calibrate focus-positioning parameters of an exposure system based on the first- and second-sensor data, wherein the first-sensor data comprises a sparse-topographic map obtained in an in-line phase and the second-sensor data comprises a detailed-topographic map obtained in the in-line phase.

* * * * *